United States Patent
Hung et al.

(10) Patent No.: US 8,222,710 B2
(45) Date of Patent: Jul. 17, 2012

(54) SENSOR STRUCTURE FOR OPTICAL PERFORMANCE ENHANCEMENT

(75) Inventors: Jhy-Ming Hung, Dacun Township, Changhua County (TW); Jen-Cheng Liu, Hsin Chu (TW); Dun-Nian Yaung, Taipei (TW); Chun-Chieh Chuang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 460 days.

(21) Appl. No.: 12/483,485

(22) Filed: Jun. 12, 2009

(65) Prior Publication Data

US 2009/0315131 A1 Dec. 24, 2009

Related U.S. Application Data

(60) Provisional application No. 61/061,385, filed on Jun. 13, 2008.

(51) Int. Cl.
*G02B 6/00* (2006.01)

(52) U.S. Cl. ........ 257/443; 257/440; 257/448; 257/461; 257/459; 257/458

(58) Field of Classification Search .................... 385/93; 257/443, 432, 440, 448, 461, 458, 459, E31.127, 257/E31.001
See application file for complete search history.

(56) References Cited

U.S. PATENT DOCUMENTS

| | | | |
|---|---|---|---|
| 6,372,603 B1 | 4/2002 | Yaung et al. | |
| 6,642,076 B1 | 11/2003 | Yaung et al. | |
| 6,815,787 B1 | 11/2004 | Yaung et al. | |
| 7,122,840 B2 | 10/2006 | Hsu et al. | |
| 7,312,093 B2 | 12/2007 | Ryu | |
| 7,880,253 B2 * | 2/2011 | Roy et al. | 257/432 |
| 2007/0241418 A1 | 10/2007 | Wang | |
| 2008/0048284 A1 * | 2/2008 | Yun | 257/432 |
| 2009/0127646 A1 * | 5/2009 | Ryu | 257/432 |
| 2009/0140361 A1 * | 6/2009 | Jeong | 257/432 |
| 2009/0315131 A1 * | 12/2009 | Hung et al. | 257/432 |
| 2011/0242350 A1 * | 10/2011 | Sawayama | 348/222.1 |

FOREIGN PATENT DOCUMENTS

| | | |
|---|---|---|
| CN | 1828868 | 9/2006 |
| CN | 101179098 | 5/2008 |

OTHER PUBLICATIONS

Chinese Patent Office, Office action dated Jun. 1, 2010, Application No. 200910149299.6, 5 pages.
M. Cohen et al., "Fully Optimized Cu Based Process With Dedicated Cavity Etch For 1.75um and 1.45um Pixel Pitch CMOS Image Sensor", STMicroelectronics, 4 pages.
Unpublished Non-Provisional Patent Application filed Jan. 25, 2008, U.S. Appl. No. 12/020,149.

\* cited by examiner

*Primary Examiner* — Michael Shingleton
(74) *Attorney, Agent, or Firm* — Haynes and Boone, LLP

(57) ABSTRACT

The present disclosure provides an image sensor semiconductor device. The image sensor semiconductor device includes an image sensor disposed in a semiconductor substrate, an inter-level dielectric (ILD) layer disposed on the semiconductor substrate, inter-metal-dielectric (IMD) layers and multi-layer interconnects (MLI) formed on the ILD layer, and a color filter formed in at least one of the IMD layers and overlying the image sensor.

20 Claims, 24 Drawing Sheets

SENSOR STRUCTURE FOR OPTICAL PERFORMANCE ENHANCEMENT

CROSS-REFERENCE

This application claims the benefit of U.S. Provisional Application 61/061,385 entitled "SENSOR STRUCTURE FOR OPTICAL PERFORMANCE ENHANCEMENT," filed Jun. 13, 2008, herein incorporated by reference in its entirety.

FIELD OF THE INVENTION

This invention relates to integrated circuits and methods of making the same. More particularly it relates to image sensors and methods of making the same.

BACKGROUND

Image sensors are integrated circuit devices that include a plurality of sensor elements or pixels formed in a semiconductor substrate. The sensor elements are used for sensing a volume of exposed light projected towards the semiconductor substrate. For image sensors, a desire exists to advance quantum efficiency (QE) when pixel size is shrunk down. QE refers to the response with which the image sensor converts light to electrons within each pixel. Various techniques are used to improve QE and sensitivity, including thinning down backside thickness of the substrate. However, when the backend thickness of the substrate is thinned down for optical light path reduction, crosstalk becomes an issue. The optical performance of the sensor is also limited by dielectric film scheme and metal thickness.

SUMMARY

The present disclosure provides an image sensor semiconductor device. The image sensor semiconductor device includes an image sensor disposed in a semiconductor substrate; an inter-level dielectric (ILD) layer disposed on the semiconductor substrate; a plurality of inter-metal-dielectric (IMD) layers and multi-layer interconnects (MLI) formed on the ILD layers; and a color filter formed in at least one of the IMD layers and overlying the image sensor.

The present disclosure also provides another embodiment of a method of fabricating a semiconductor device. The method includes forming an image sensor in a semiconductor substrate; forming a plurality of inter-metal-dielectric (IMD) layers and multilayer interconnects (MLI) on the semiconductor substrate; forming a hole that extends vertically within at least one of the IMD layers and overlying the image sensor; and filling the hole with a color filter material to form a color filter.

The present disclosure also provides one embodiment of an image sensor device. The image sensor device includes an image sensor element disposed in a silicon substrate; a plurality of inter-metal-dielectric (IMD) layers and multilayer interconnects (MLI) formed on the silicon substrate; and a color filter filled in a structure that extends vertically within the IMD layers, the color filter being vertically aligned with an image-sensing region of the image sensor.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
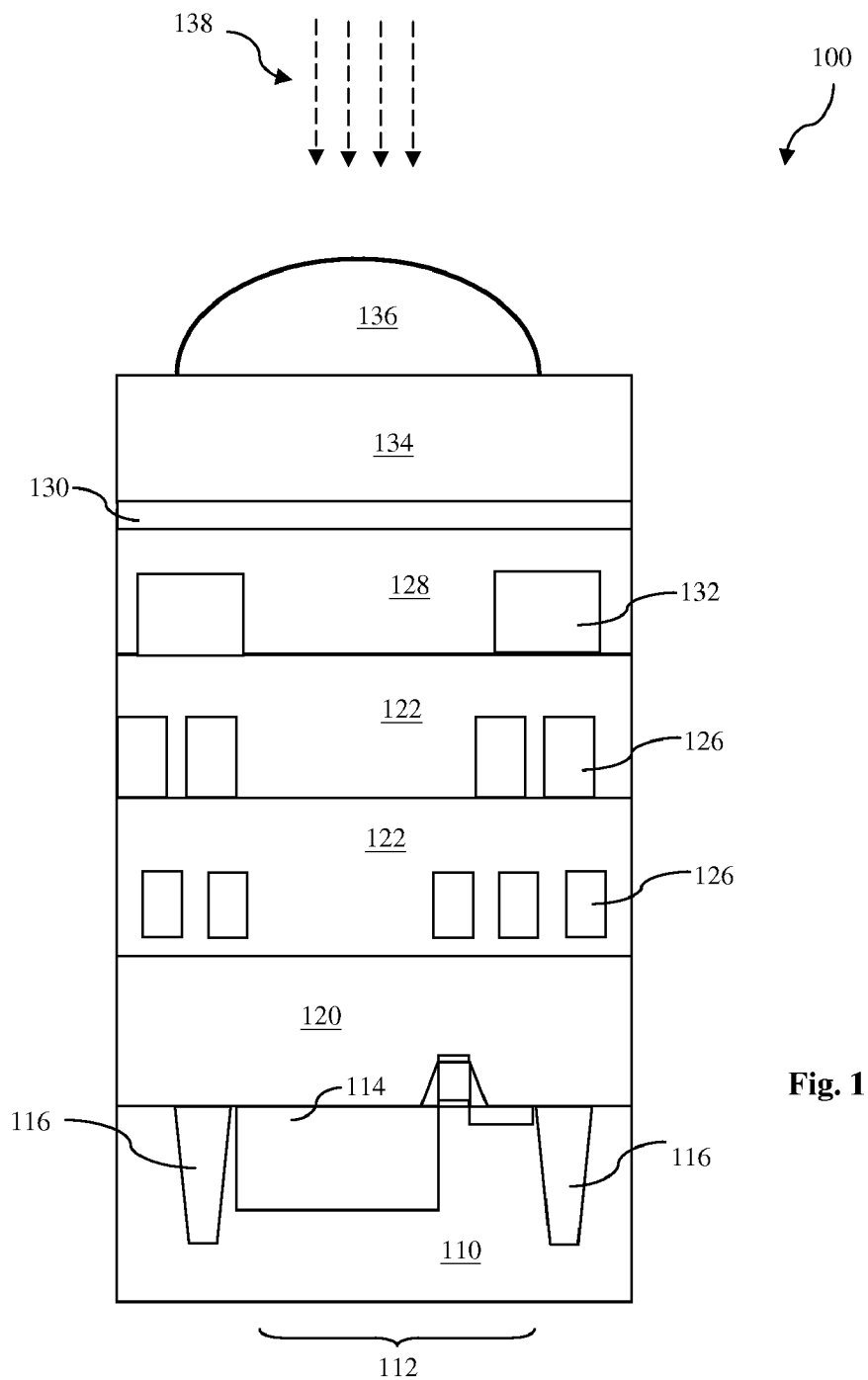
FIG. 1 illustrates a sectional view of a conventional existing image sensor.

It is to be understood that the following disclosure provides many different embodiments, or examples, that may benefit from the present invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a sectional view of a conventional image sensor circuit 100. The circuit 100 includes a semiconductor substrate 110 and an image sensor 112 formed in the substrate 110. The image sensor 112 further includes an image sensing region 114. The substrate 110 further includes isolation features, such as shallow trench isolation (STI) 116 configured for isolation. The circuit 100 further includes inter-layer dielectric 120, a plurality of inter-metal dielectric (IMD) layers 122/124 and a plurality of metal layers 126 formed on the substrate 110. The circuit 100 also includes passivation layers 128 and 130 formed on the IMD 122/124 and a topmost metal layer 132 formed in the passivation layers. A color filter 134 is formed on the passivation layer 130, and a micro lens 136 is formed on the color filter 134. In field applications, light beams 138 from an object to be imaged shines on the micro lens 136, expecting to be received by the image sensing region 114. In this configuration, the color filter 134 and the micro lens 136 are positioned a large distance away from the image sensor 112, about 2 to 4 microns in one example. Due to this large distance, the imaging efficiency is dramatically reduced, resulting in degraded optical performance of the image sensor.

Figure 2:
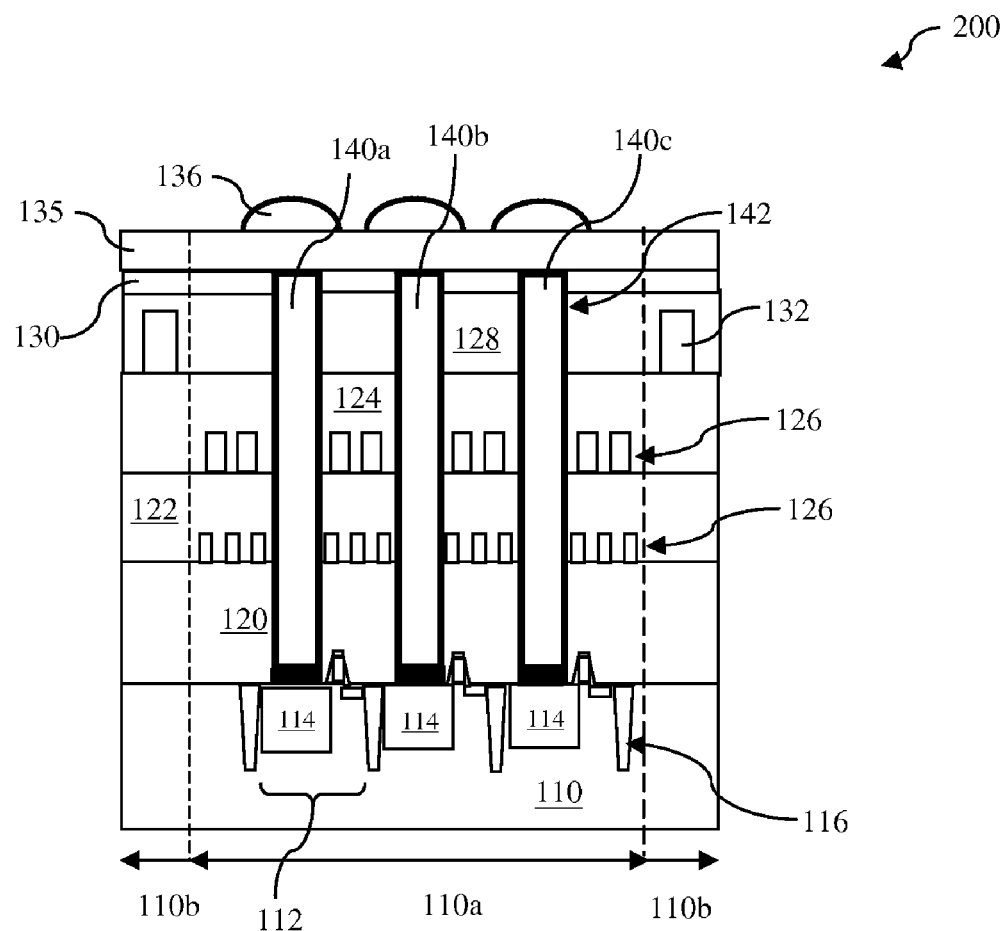
FIG. 2 illustrates a sectional view of one embodiment of an integrated circuit constructed according to aspects of the present disclosure.

FIG. 2 illustrates a sectional view of one embodiment of an integrated circuit 200 constructed according to aspects of the present disclosure. The integrated circuit 200 includes a semiconductor substrate 110 having one or more image sensor 112 formed therein. The substrate 110 includes silicon in a crystalline structure. The substrate 110 may alternatively or additionally include other semiconductor material such as germanium, gallium arsenic, or indium phosphide. The substrate 110 may include various p-type doped regions and/or n-type doped regions configured and coupled to form various devices and functional features. All doping features may be achieved using a process such as ion implantation or diffusion in various steps and techniques. The substrate 110 may include other features such as a shallow trench isolation (STI) 116, properly configured for isolation. The substrate 110 includes a pixel-array area 110a designed for image sensor and a periphery area 110b surrounding the pixel-array area 110a.

The image sensor 112 includes an image-sensing region (or light-sensing region) 114 which may be a doped region having a N-type or P-type dopant formed in the semiconductor substrate 110 by a method such as diffusion or ion implantation. The light-sensing region 114 may have a doping concentration ranging between about $10^{14}$ and $10^{21}$ atoms/cm$^3$. Examples of the image sensor 112 include a photodiode, a complimentary metal-oxide-semiconductor (CMOS) image sensor, a charged coupling device (CCD) sensor, an active sensor, a passive sensor, and/or other types of devices diffused or otherwise formed in the substrate 110. As such, the image sensor 112 may include conventional and/or future-developed imaging devices.

The image sensor 112 is provided here only for example. The integrated circuit 200 may include a plurality of image sensors disposed in an array or other proper configuration. The plurality of image sensors may be designed to have various sensor types. For example, one group of the image sensors may be CMOS image sensors and another group of the image sensors may be passive sensors.

The circuit 200 also includes an inter-layer dielectric (ILD) 120 disposed on the semiconductor substrate 110. The circuit 200 further includes a plurality of inter-metal dielectric (IMD) layers 122/124, multilayer interconnects (MLI) 126, and the topmost metal 132 on the semiconductor substrate 110. The MLI structure (including MLI 126 and the topmost metal 132) is electrically coupled to the image sensor 112 and other electric units formed in the semiconductor substrate 110. The circuit 200 also includes passivation layers 128 and 130 formed on the IMD 122/124 and a topmost metal layer 132 formed in the passivation layers. FIG. 2 illustrates an exemplary MLI structure with three metal layers for illustration. The MLI structure includes various metal features, such as metal one, metal two, and metal three. The MLI structure further includes contact features configured between metal one and the semiconductor substrate, coupling the metal one and semiconductor substrate. The MLI structure further includes vias each configured between adjacent metal layers, coupling adjacent metal layers to one another. The MLI structure includes copper. In one embodiment, the MLI structure is formed using damascene technology. The MLI structure may collectively include other conductive materials such as copper alloy, titanium, titanium nitride, tantalum, tantalum nitride, tungsten, polysilicon, metal silicide, or combinations thereof. In one embodiment, silicide may be formed on the gate and/or source/drain for reduced contact resistance. The metal silicide may include nickel silicide, cobalt silicide, tungsten silicide, tantalum silicide, titanium silicide, platinum silicide, erbium silicide, palladium silicide, or combinations thereof. In another embodiment, aluminum is used for interconnect with aluminum technology known in the art. For example, the aluminum alloy including copper and silicon may be used to form interconnection. In this case, a metal etching process may be used to form metal lines. In another embodiment, tungsten may be used to form tungsten plugs for various vias with better via filling effect. The MLI structure may include multiple-layer structures. In one example for copper technology, the multiple-layer structures may include barrier layer, a copper seed layer, and bulk copper. In another example for aluminum technology, the multiple-layer structures may include barrier layer, an aluminum layer, and anti-reflective coating layer (such as titanium nitride). In another embodiment, the topmost metal layer includes aluminum and the rest of the metal layers include copper.

The multilayer interconnect 126 may be formed by a technique such as chemical vapor deposition, physical vapor deposition (PVD or sputtering), plating, other suitable processes, or combinations thereof. For example, PVD may be used to form a copper seed layer, and then a plating process may be employed to deposit bulk copper for interconnection. The three metal layers in FIG. 2 are only for example and simplicity. In various embodiments, MLI 126 may include less or more than three metal layers. MLI 126 is designed and disposed without blocking the image sensor 112 from imaging light.

ILD 120 and IMD 122/124 are disposed on the semiconductor substrate 110 to electrically isolate the MLI structure. ILD 120 and IMD 122/124 may further include various etch stop/barrier layers (referred to as a barrier layer for simplicity) interposed between adjacent IMD layers. The barrier layer may provide an etch stop function utilized during damascene processes or a barrier function to eliminate moisture diffusion to MLI 126 and copper migration to the ILD and IMD. The barrier layer may include silicon nitride, silicon oxynitride, or other suitable materials.

Each of the ILD and IMD layers may have a thickness ranging between about 100 nanometer and 1000 nanometer (or 1 micron). In one instance, ILD 120 has a thickness ranging between about 350 nanometer and about 700 nanometer. In other examples, the IMD layer between the via one and via two has a thickness ranging between about 100 nanometer and about 400 nanometer. The IMD layer between the metal one and metal two has a thickness ranging between about 100 nanometer and about 500 nanometer. The IMD layers at higher metal levels may have a greater thickness. IMD and ILD may include silicon dioxide such as undoped silica glass (USG), silicon nitride, silicon oxynitride, polyimide, spin-on glass (SOG), fluoride-doped silicate glass (FSG), carbon doped silicon oxide such as SiCOH, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), and/or other suitable materials. ILD and IMD may be formed by any technique including spin-on, CVD, sputtering, or other suitable processes. For example, plasma enhanced (PE) CVD may be utilized to form silicon oxide from silane (SiH$_4$) or tetraethoxysilane (TEOS). In another example, high density plasma (HDP) CVD may be utilized.

MLI 126 and ILD/IMD may be formed in an integrated process referred to as a damascene process, such as a dual damascene process or a single damascene process. In one example, each of a metal layer, via, and contact may be formed by a processing flow described below. An etch stop and/or barrier layer is first formed on the semiconductor device 200. The etch stop layer may include silicon nitride or silicon oxynitride. A dielectric material is deposited on the etch stop layer to form a dielectric layer and may be further planarized by a process such as a chemical mechanical planarizing (CMP) process or an etch back process. A CMP stop layer may be formed on the dielectric layer. The dielectric layer is then etched to form a trench according to a pre-designed circuit pattern by a photolithography process. A lining material layer (or a lining layer) for barrier and/or adhesion is deposited in the trench by a method such as sputtering or CVD. The lining layer includes a dielectric material. Copper is then filled in the lined trench by a sputtering process to form a copper seed layer and a plating process to form copper filling. Then, copper formed on the dielectric layer may be removed and the semiconductor device 200 may be planarized by a CMP or etch back process. Alternatively, MLI 126 and ILD/IMD may be formed by a dual damascene process in various embodiments known in the art.

The device 200 further includes a passivation layer 128 on IMD 122/124 and MLI 126 to substantially cover the semiconductor device and seal the device from moisture and other contamination. In one example, the passivation layer 128 includes silicon oxide. The device 200 may further include a second passivation layer 130 disposed on the first passivation layer 128 for enhanced passivation and adhesion. The second passivation layer 130 includes silicon nitride in one example.

As illustrated in FIG. 2, the device 200 includes one or more micro lenses 136 formed on the passivation layer 130. The micro lens 136 is substantially aligned with the image sensing region 114 for imaging efficiency. In one embodiment, a flat layer 135 is interposed between the micro lens 136 and the passivation layer 130 for various purposes including providing a flat surface to a plurality of micro lenses. The flat layer is transparent to the imaging light. In one example, silicon oxide is used to form the flat layer.

The device 200 includes one or more color filters 140a, 140b and 140c (or collectively 140) formed in the IMD 122/124 as illustrated in FIG. 2. The color filter 140 is vertically configured between the micro lens 136 and the image sensing region 114, and further aligned with the micro lens 136 and the image-sensing region 114 for imaging efficiency. The material of the color filter 140 is chosen to filter the light by wavelength range. In one embodiment, the color filters 140 includes a polymeric material. In furtherance of the embodiment, the color filter may use photoresist with color dyes (or pigment). For example, the color filter includes diazonaphthoquinone (DNQ) novolac photoresist. For another example, the color filter material includes negative photoresist based on an acrylic polymer. The color filter material may include negative photoresist based on an acrylic polymer incorporated with color pigments. In another embodiment, the color filter material includes resin. In another embodiment, the color filter layer 140 may include various pixels configured with different materials such that the light in a certain wavelength range can pass through the color filter of the corresponding pixel. For example, the device 200 illustrates three exemplary color filters: 140a as a red color filter, 140b as a green color filter and 140c as a blue color filter. In this case, the red color filter 140a includes a red color filter material; the green color filter 140b includes a green color filter material; and the blue color filter 140c includes a blue color filter material.

To form the color filter in IMD, a method is described below. A hollow structure (or a hole) is first formed in the IMD. The hole is defined such that the image-sensing region is aligned with the hole. The hole includes a depth extending to different levels in various embodiments. In one embodiment, the hole has a depth extending to the surface of the image-sensing region 114. In other embodiments, the hole does not extend to the surface of the image-sensing region 114, and a portion of the ILD remains interposed between the hole and the image-sensing region 114. In other embodiments, the hole extends into the ILD, to the top surface of the ILD, or only into the top IMD layer. In another embodiment, the hole and image-sensing region is only interposed by an etch stop layer. In one embodiment, the hole has horizontal dimensions such that the hole is substantially enclosed in the image-sensing region in a top view. The sectional shape of the color filter may have various proper shapes, such as a round shape and a rectangle shape. In one embodiment, the hole has a profile having a constant shape and dimension at various heights. In another embodiment, the hole has a tapered profile with a wider opening at the top surface. In another embodiment, the hole has a stepwise profile with a wider opening at the top surface.

The hole may be formed by a processing flow including lithography patterning and etching. For example, a photoresist layer is applied to the passivation/IMD layers and is patterned to have an opening by a lithography process. Then, the passivation/IMD layers are etched through the opening of the patterned photoresist to a proper depth, such as reaching the substrate and exposing the image-sensing region. The etching process may employ a dry etching technique and utilize a carbon fluorine based etchant and oxygen gas. Alternatively, the etching process may employ a wet etching technique, utilizing a hydrofluoric acid (HF)-based etchant. In another embodiment, an etch stop layer may be formed on the semiconductor substrate 110 before the formation of the ILD 120. Thus, the etching process will stop on the etch stop layer. The etch stop layer in the trench may be removed by other etching processes to expose the underlying image sensor. In another embodiment, an etch stop layer may be disposed at a predefined level such that the hole extends thereto. In another embodiment, a hard mask layer may be utilized in forming the hole. In one embodiment, the hole with a tapered profile can be formed by implementing a tunable etching process. For example, the etching parameters, such as etchant or an electric bias to a dry etching, can be continuously tuned to form the hole with a tapered profile. In one embodiment, a dry etching process and a wet etching process are combined to form the hole with a tapered profile. For example, a dry etching is applied first and a wet etching process is applied thereafter such that a tapered hole with a wider opening is achieved. In another embodiment, multiple etching steps may be implemented with multiple photolithography processing steps and multiple etch stop layers to form a stepwise hole with a wider opening. In one example, a hard mask layer is applied to the passivation/IMD layers. A photoresist layer is applied on the hard mask layer and patterned to form an opening by a lithography process. The hard mask layer is then etched to transfer the opening from the photoresist layer to the hard mask layer. The photoresist layer is removed by a wet stripping or a plasma ashing thereafter. Then, the IMD is etched through the opening of the hard mask layer to form the hole.

The hole is then filled by a color filter material. In various embodiments, the color filter material includes negative photoresist based on an acrylic polymer or resin. Additionally, in one embodiment, a lining material layer 142 is formed on sidewalls of the hole before the filling thereof. The lining material layer 142 may function as a barrier layer to prevent any diffusion from the color filter to the IMD or substrate. For example, the color filter may include metal for color selection. The barrier layer can prevent the metal in the color filter from diffusing into the substrate and the IMD/ILD. In one example, the lining material layer includes silicon nitride.

In another embodiment, the hole is formed to extend to the surface of the image-sensing region 114. Then, a transparent material is filled in the hole to a level where the color filter material starts to fill the hole. The transparent material may include undoped silica glass (USG), silicon oxide from silane ($SiH_4$) by plasma enhanced CVD, silicon oxide from tetraethoxysilane (TEOS) by plasma enhanced CVD, or high density plasma (HDP) CVD, spin-on glass, or combinations thereof.

In one embodiment, a planarizing process may be further applied to the device 200, after the color filter material is filled in the hole, to planarize the device 200 and remove excessive color filter material. The planarizing process may include an etch back, CMP, or combinations thereof. In another embodiment, the lining material layer 142 and the second passivation layer 130 can be formed simultaneously in a same process. In the disclosed image sensor device 200 as illustrated in FIG. 2, the optical path from the micro lens to the image-sensing region is reduced, and the imaging efficiency is greatly improved.

Figure 3:
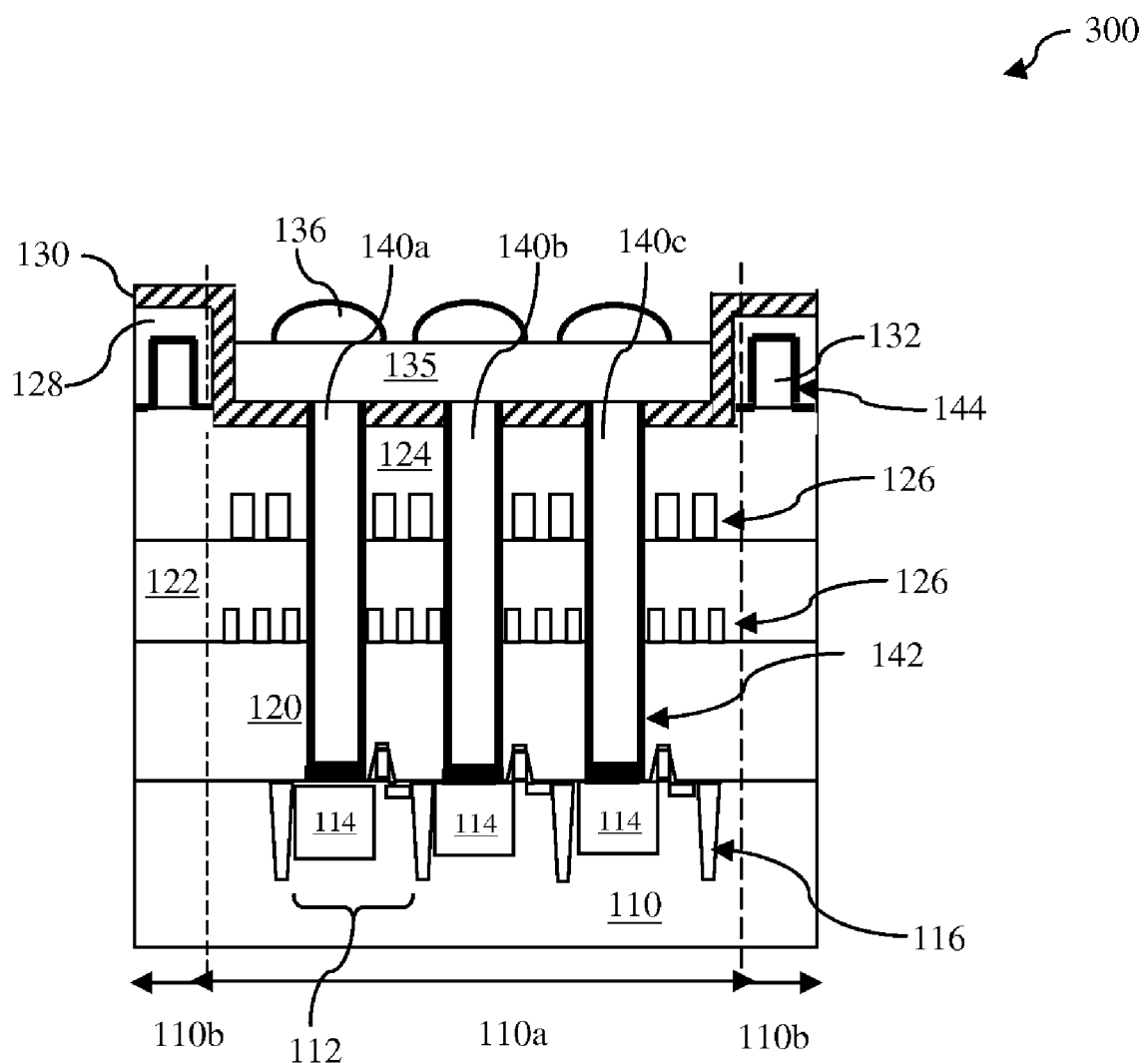
FIG. 3 illustrates a sectional view of another embodiment of an integrated circuit constructed according to aspects of the present disclosure.

FIG. 3 illustrates a sectional view of another embodiment of an image sensor device 300 constructed according to aspects of the present disclosure. The description will be concise for simplicity considering the device 300 has components similar to those of the device 200. The device 300 includes a semiconductor substrate 110 having one or more image sensors 112 formed therein. The substrate 110 may include other features such as a shallow trench isolation (STI) 116. The substrate 110 includes a pixel-array area 110a designed for image sensors and a periphery area 110b surrounding the pixel-array area 110a.

The image sensor 112 includes an image-sensing region (or light-sensing region) 114, which may be a doped region having a N-type or P-type dopant formed in the semiconductor substrate 110. Examples of the image sensor 112 include a photodiode, a complimentary metal-oxide-semiconductor (CMOS) image sensor, a charged coupling device (CCD) sensor, an active sensor, a passive sensor, and/or other types of devices diffused or otherwise formed in the substrate 110. The image sensor 112 is provided here only for example. The device 300 may include a plurality of image sensors disposed in an array or other proper configuration.

The device 300 also includes an inter-layer dielectric (ILD) 120 disposed on the semiconductor substrate 110. The device 300 further includes multilayer interconnects (MLI) 126 and a plurality of inter-metal dielectric (IMD) layers 122/124 on ILD 120. MLI 126 is coupled to the image sensor 112 and other electric units formed in the semiconductor substrate 110. MLI 126 include the topmost metal layer 132. FIG. 3 illustrates an exemplary MLI structure with three metal layers. In this embodiment, the topmost metal features (or topmost metal layer) 132 are disposed in the periphery region 110b and formed above the color filter 140. MLI 126 and ILD/IMD may be formed in an integrated process referred to as a damascene process, such as a dual damascene process or a single damascene process. The topmost metal features 126a may include a bonding pad or a probe test pad. The device 300 further includes an etch stop layer 144 disposed on the topmost metal features. The device 300 also includes a passivation layer 128 on IMD 122/124 and MLI 126 to substantially cover the semiconductor device and seal the device from moisture and other contamination. In one example, the passivation layer 128 includes silicon oxide. The device 300 may include a second passivation layer 130 disposed on the first passivation layer 128 for enhanced passivation and adhesion. The second passivation layer 130 includes silicon nitride in one example.

The device 300 includes one or more micro lenses 136 formed on the passivation layer 130. The micro lens 136 is substantially aligned with the image sensing region 114 for imaging efficiency. In one embodiment, a flat layer 135 is interposed between the micro lens 136 and the passivation layer 130. The flat layer 135 is transparent to the imaging light. In one example, silicon oxide is used to form the flat layer 135.

The device 300 includes one or more color filters 140 formed in the IMD 122/124. The color filter 140 is vertically configured between the micro lens 136 and the image sensing region 114, and further aligned with the micro lens 136 and the image-sensing region 114 for imaging efficiency. In formation of the color filter 140 in the IMD 122/124, a hollow structure (or a hole) is first formed in the IMD. The hole is defined such that the image-sensing region is aligned with the hole. The hole includes a depth extending to different levels in various embodiments. In one embodiment, the minimum distance from the hole to the top surface of the image-sensing region 114 can be down to zero. In furtherance of the embodiment, the bottom surface of the hole is on an etch stop layer. In another embodiment, the bottom surface of the hole is on the top surface of the image-sensing region by further removing the etch stop layer. In other embodiment, the hole does not extend to the surface of the image-sensing region 114 and a portion of the ILD remains interposed between the hole and the image-sensing region 114. In other embodiments, the hole extends into the ILD, to the top surface of the ILD, or only into the top IMD layer. In one embodiment, the hole has horizontal dimensions such that the hole is substantially enclosed in the image-sensing region in a top view. In one embodiment, the hole has a profile having a constant shape and dimension at various heights. In another embodiment, the hole has a tapered profile with a wider opening at the top surface. In another embodiment, the hole has a stepwise profile with a wider opening at the top surface. The hole may be formed by a processing flow including lithography patterning and etching. In another embodiment, an etch stop layer may be formed on the semiconductor substrate 110 before the formation of the ILD 120. Thus, the etching process will stop on the etch stop layer. The etch stop layer in the trench may be removed by other etching processes to expose the underlying image sensor. In another embodiment, an etch stop layer may be disposed at a predefined level such that the hole extends thereto.

The color filter 140 is formed below the topmost metal features. The micro lens 136 is disposed at least partially within the vertical dimension of the topmost metal features as shown in FIG. 3. The color filter is formed by etching a hole in the IMD and then filling the hole with a color filter material. In one embodiment, the color filter material includes a polymeric material (e.g., negative photoresist based on an acrylic polymer) or resin. The color filter material may include negative photoresist based on an acrylic polymer including color pigments. Thus, the optical path from the micro lens to the image-sensing region is further reduced and the imaging efficiency is further enhanced. Additionally, in one embodiment, a lining material layer 142 is formed on sidewalls of the hole before the filling thereof. In one example, the lining material layer includes silicon nitride.

In one embodiment, to form the image sensor device 300 with color filters vertically below the topmost metal feature, a trench is formed within the pixel-array area 110a after the formation of the multilayer metal features. The trench extends to the bottom surface of the topmost metal features. The passivation layers are then deposited on the device 300 including the trench. The flat layer 135 and the micro lens 136 are then formed in the trench. In another embodiment, the topmost metal feature extends vertically within a first dimension. The micro lens overlying the color filter vertically extends at least partially within the first dimension.

In another embodiment, after the hole is formed to extend to the surface of the image-sensing region 114, a transparent material is first filled in the hole to a level where the color filter material starts to fill the hole. The transparent material may include undoped silica glass (USG), silicon oxide from silane (SiH$_4$) by plasma enhanced CVD, silicon oxide from tetraethoxysilane (TEOS) by plasma enhanced CVD, or high density plasma (HDP) CVD, spin-on glass, or combinations thereof. A planarizing process may be further applied to the device 300 after the color filter material is filled in the hole to planarize the device 300 and remove excessive color filter material. The planarizing process may include an etch back, CMP, or combinations thereof. In another embodiment, the color filter has a sectional area ranging between about 0.36 micron$^2$ and about 17.64 micron$^2$.

FIGS. 4 through 12 illustrate sectional views of an image sensor device in various embodiments constructed according to various aspects of the present disclosure. In case the optical performance of the image sensor device has variation associated with the properties of the color filter, the height of the color filter can be changed to compensate such variation. For example, an optical transparent material can be interposed between the IMD layers or between IMD and ILD. In another example, the optical transparent material is disposed on the substrate as an etch stop layer of ILD to control the depth of the color filter hole. As mentioned earlier, the color filter hole may have a substantially vertical profile (constant sectional shape and size), a tapered profile, a stepwise profile, or combinations thereof, achieved by the lithography process and etching process.

Figure 4:
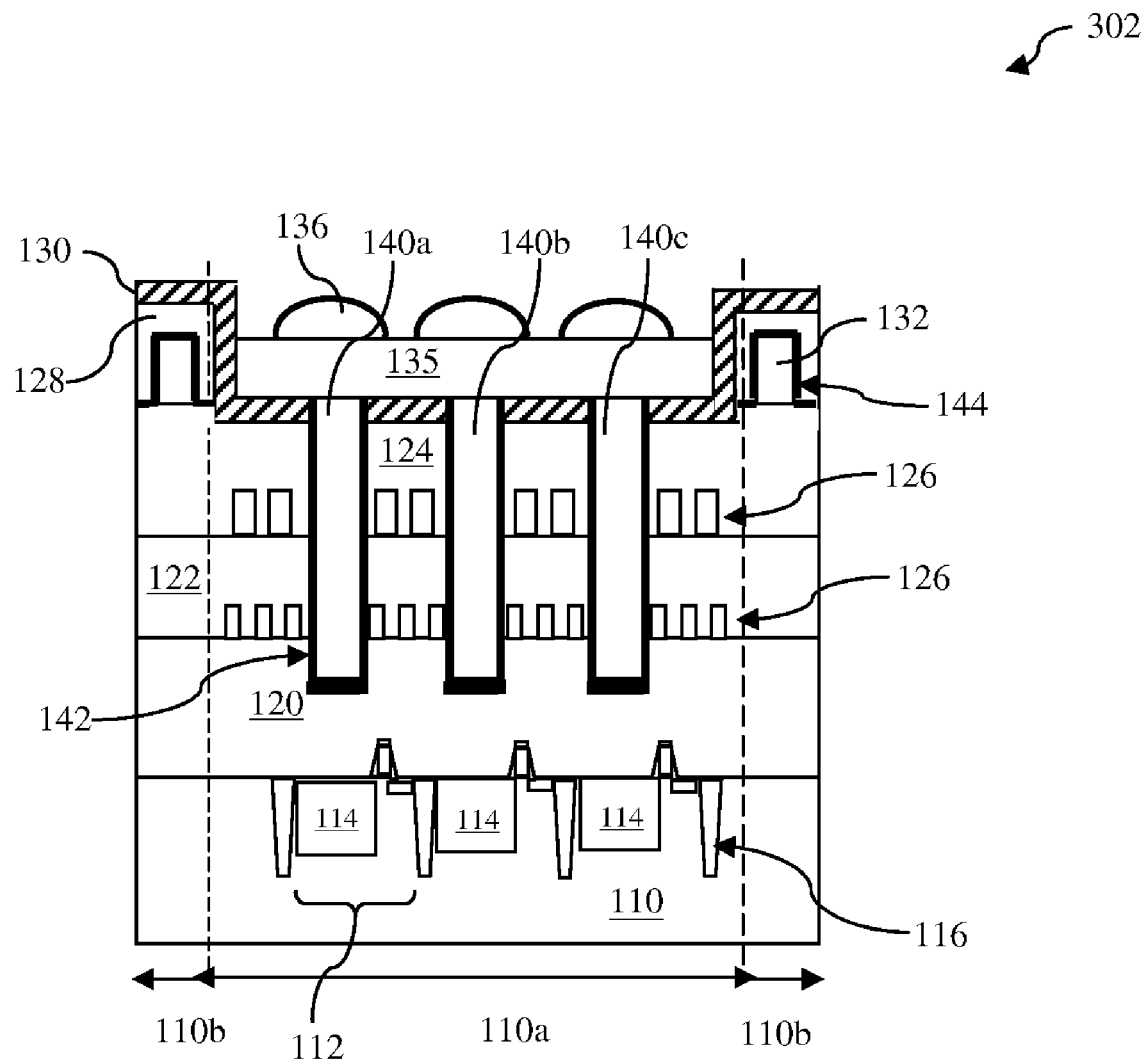
FIGS. 4 through 12 illustrate sectional views of an integrated circuit in various embodiments constructed according to aspects of the present disclosure.

The image sensor device 302 illustrated in FIG. 4 includes a color filter extending into the ILD layer and is a distance away from the image sensor. The color filter has a vertical profile and is further recessed below the topmost metal features.

Figure 5:
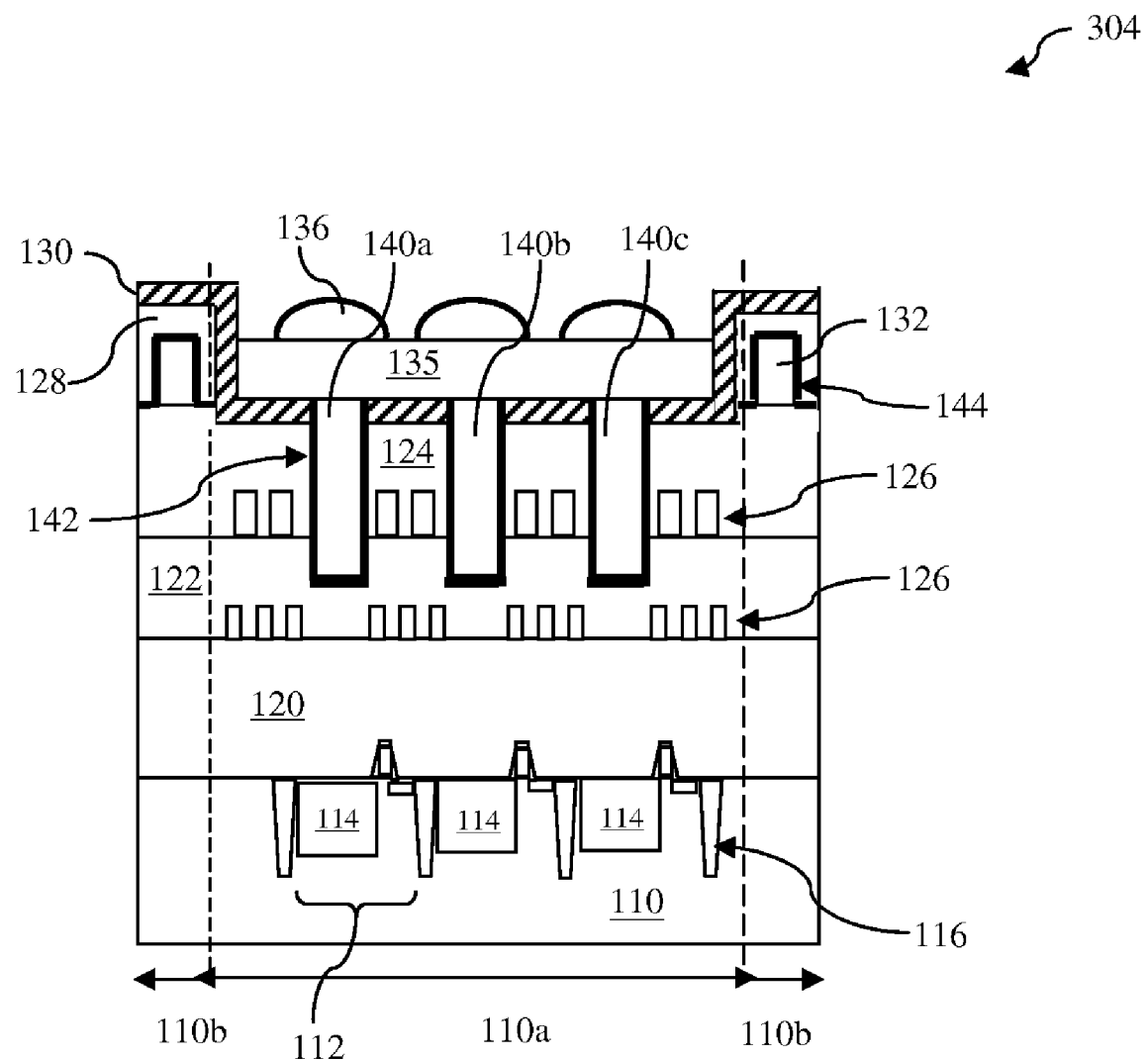

The image sensor device 304 illustrated in FIG. 5 includes a color filter extending into the first IMD layer. The color filter has a vertical profile and is further recessed below the topmost metal features.

Figure 6:
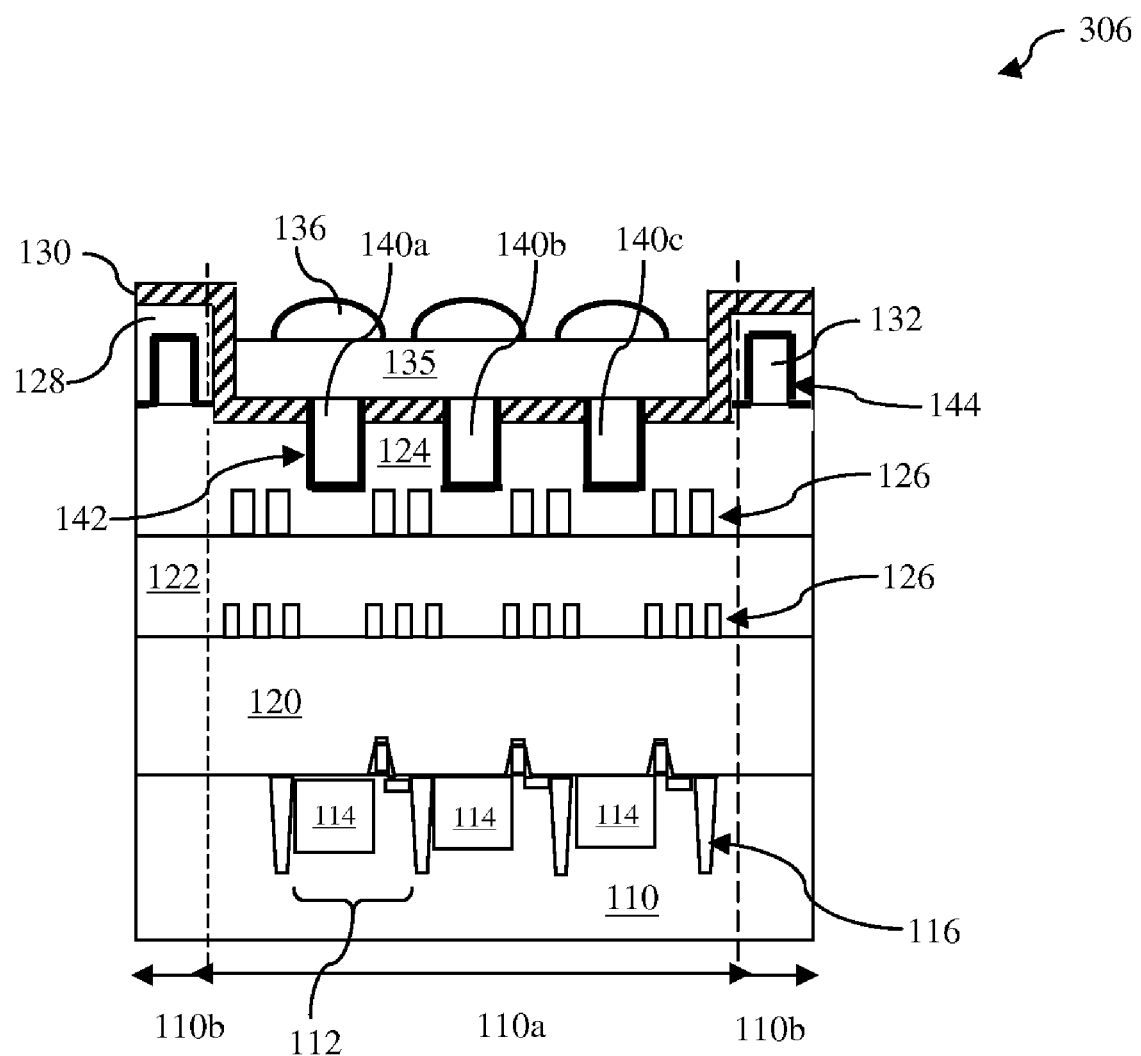

The image sensor device 306 illustrated in FIG. 6 includes a color filter extending into the second IMD layer. The color filter includes a vertical profile and is further recessed below the topmost metal features.

Figure 7:
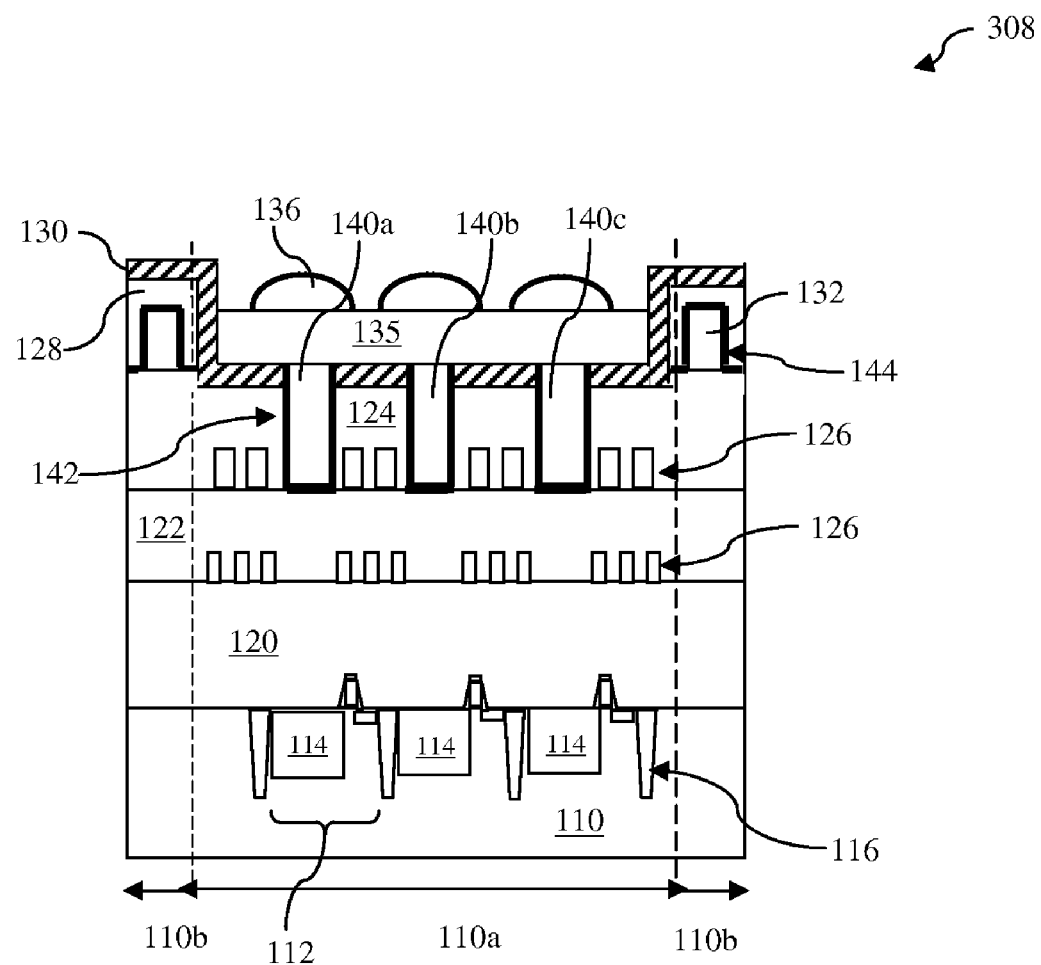

The image sensor device 308 illustrated in FIG. 7 includes a color filter extending and stopping at an interface between two adjacent IMD layers. The color filter includes a vertical profile and is further recessed below the topmost metal features.

Figure 8:
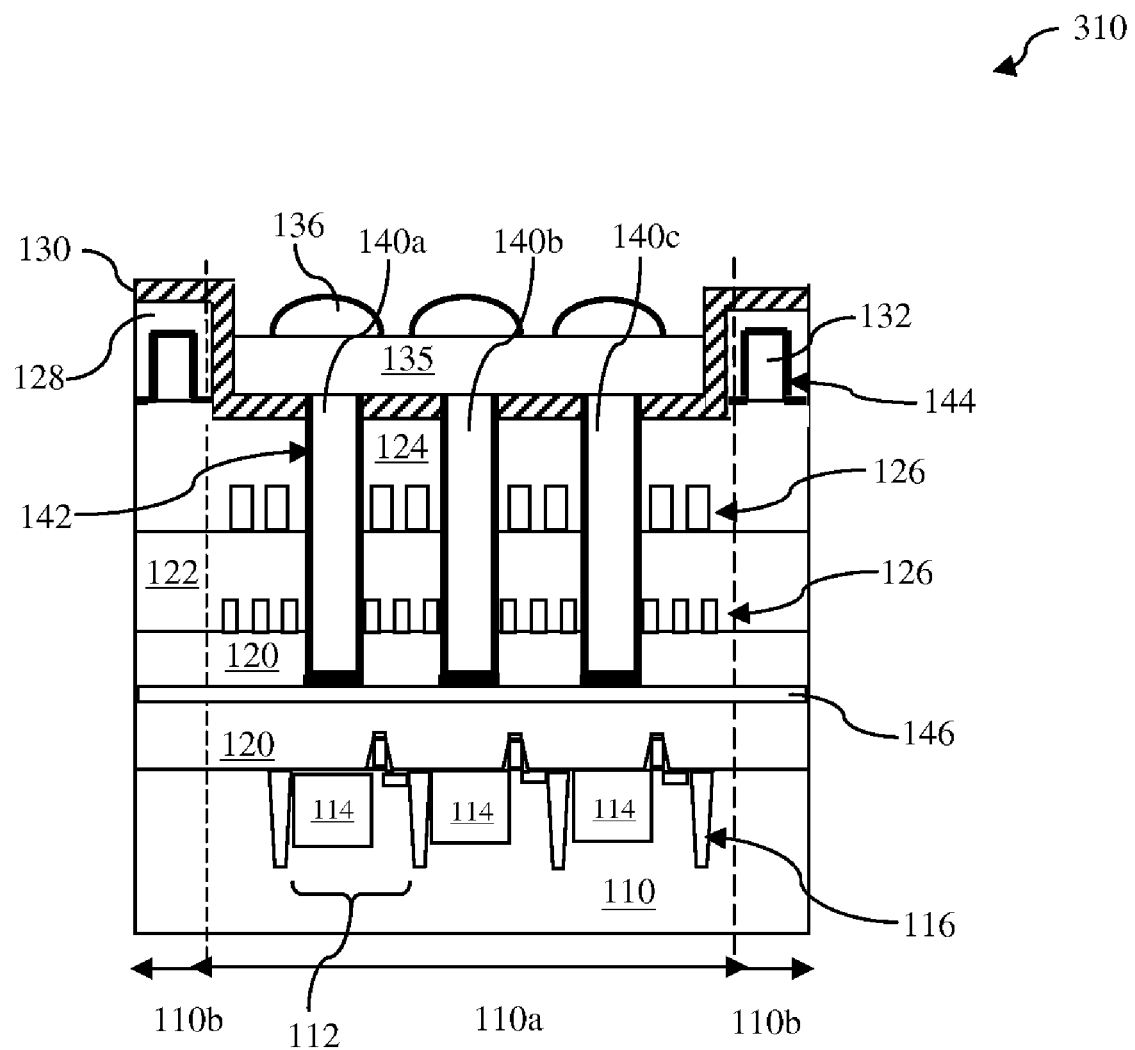

The image sensor device 310 illustrated in FIG. 8 includes a color filter extending to an etch stop layer 146 properly configured to control the depth of the color filter hole. The color filter includes a vertical profile and is further recessed below the topmost metal features.

Figure 9:
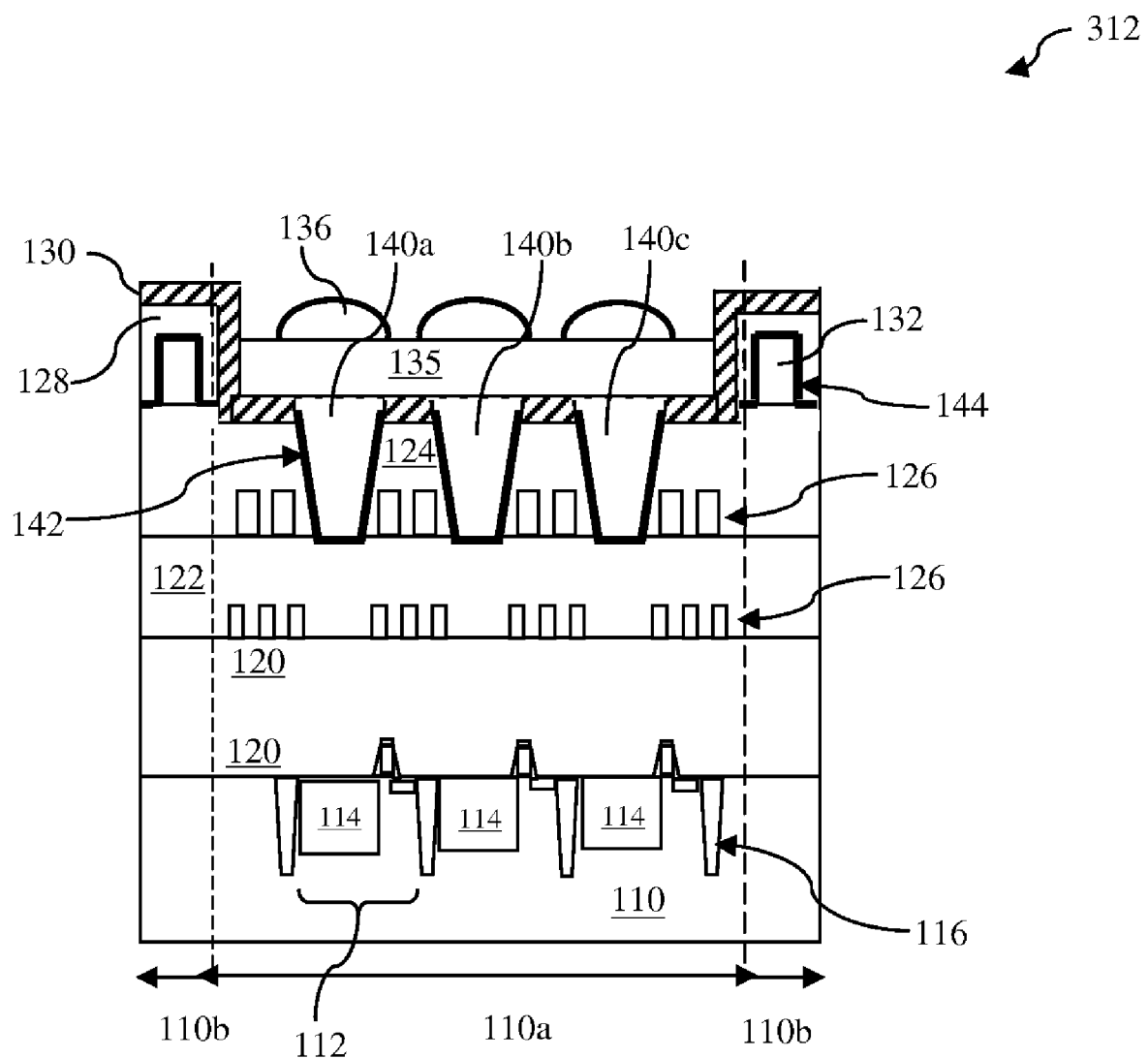

The image sensor device 312 illustrated in FIG. 9 includes a color filter extending to an interface between two adjacent IMD layers. The color filter includes a tapered profile with a greater sectional area at the top surface and is further recessed below the topmost metal features.

Figure 10:
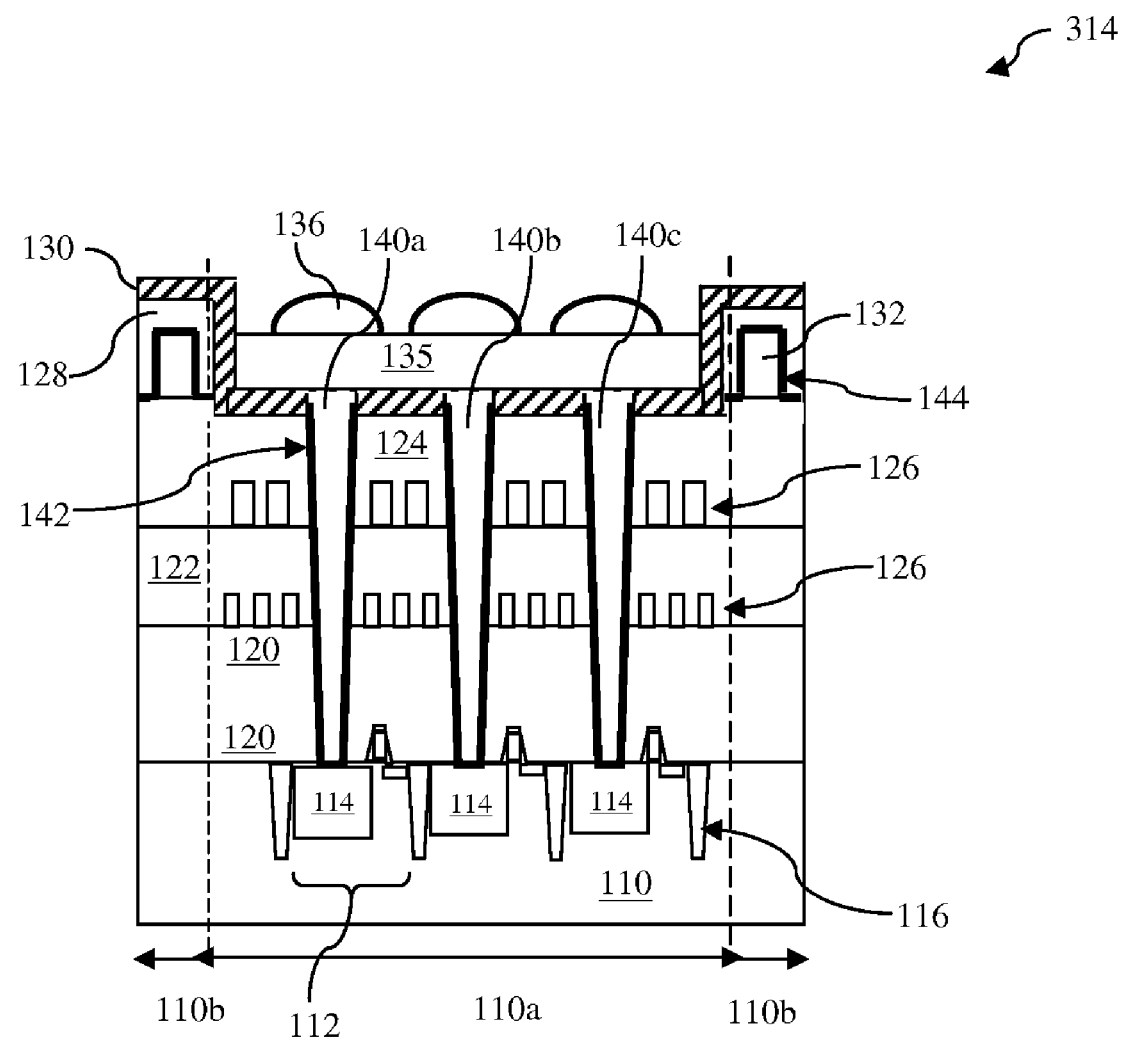

The image sensor device 314 illustrated in FIG. 10 includes a color filter with a tapered profile having a greater sectional area at the top surface. The color filter is further recessed below the topmost metal features and may extend to the substrate.

Figure 11:
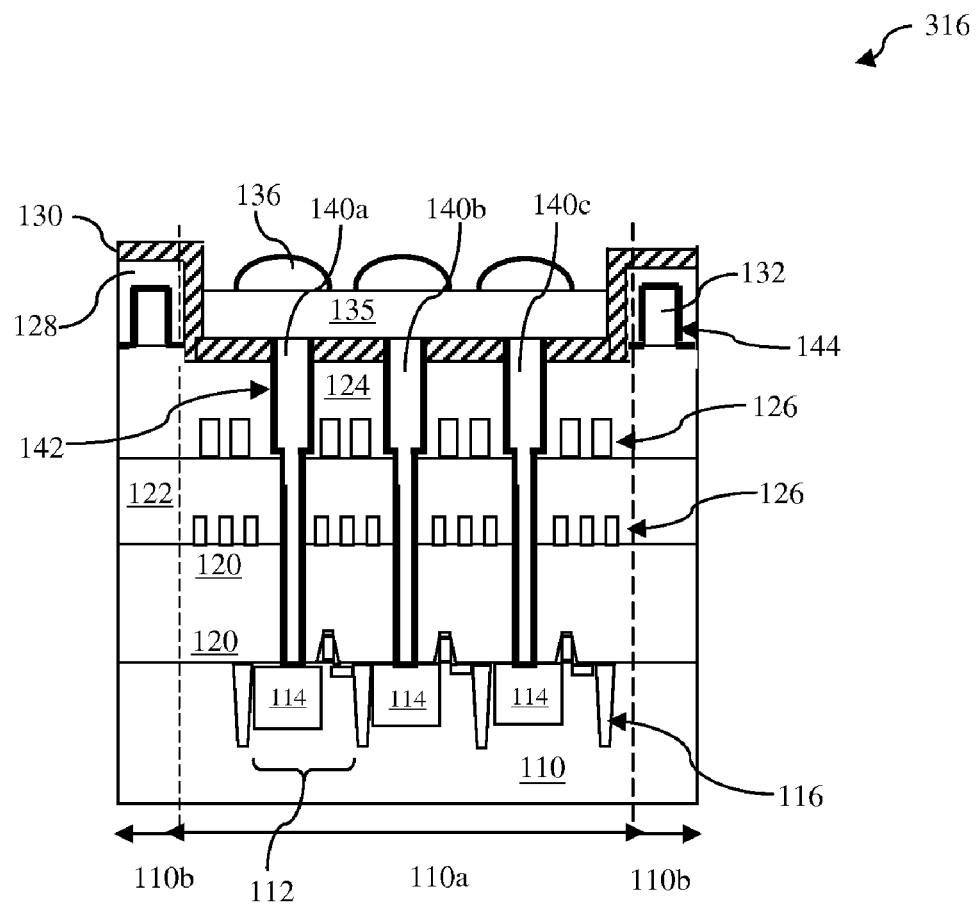

The image sensor device 316 illustrated in FIG. 11 includes a color filter with a stepwise profile (e.g., two-steps) having a greater sectional area near the micro lens for imaging efficiency. The stepwise color filter can be formed by multiple photolithography and etching steps, such as two etching steps.

Figure 12:
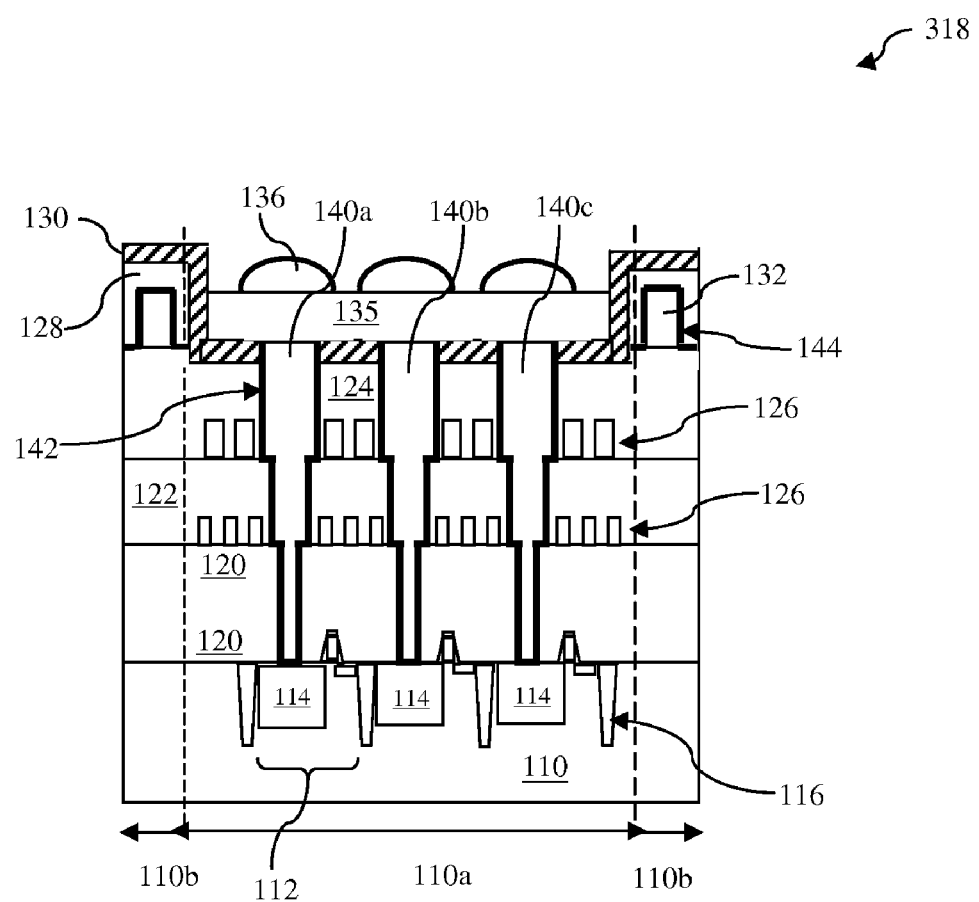

The image sensor device 318 illustrated in FIG. 12 includes a color filter with a three-step profile to enlarge the opening near the micro lens. The three-step color filter can be formed by three photolithography steps and three etching steps.

The image sensor device in various embodiments of the present disclosure has color filters disposed in one or more inter-metal dielectric layers. One or more advantages are present in different embodiments and applications. For example, the optical path between the micro lens and the image sensor is reduced. The quantum-efficiency and sensitivity of the sensor are improved. The crosstalk is reduced. The light diffraction is decreased and the image distortion is reduced accordingly. The process is simple and easy to implement. Furthermore, the structure and the method can easily extend to other generations of image sensor devices and fabrication technologies. It is understood that different embodiments offer different advantages, and that no particular advantage is necessarily required for all embodiments.

FIGS. 13 through 16 illustrate sectional views of an image sensor device at various fabrication stages in one embodiment constructed according to aspects of the present disclosure. The image sensor device 320 and the method of making the same are further provided as an example and are collectively described below with reference to FIGS. 13 through 16. The various description for the similar features may be eliminated for simplicity.

Figure 13:
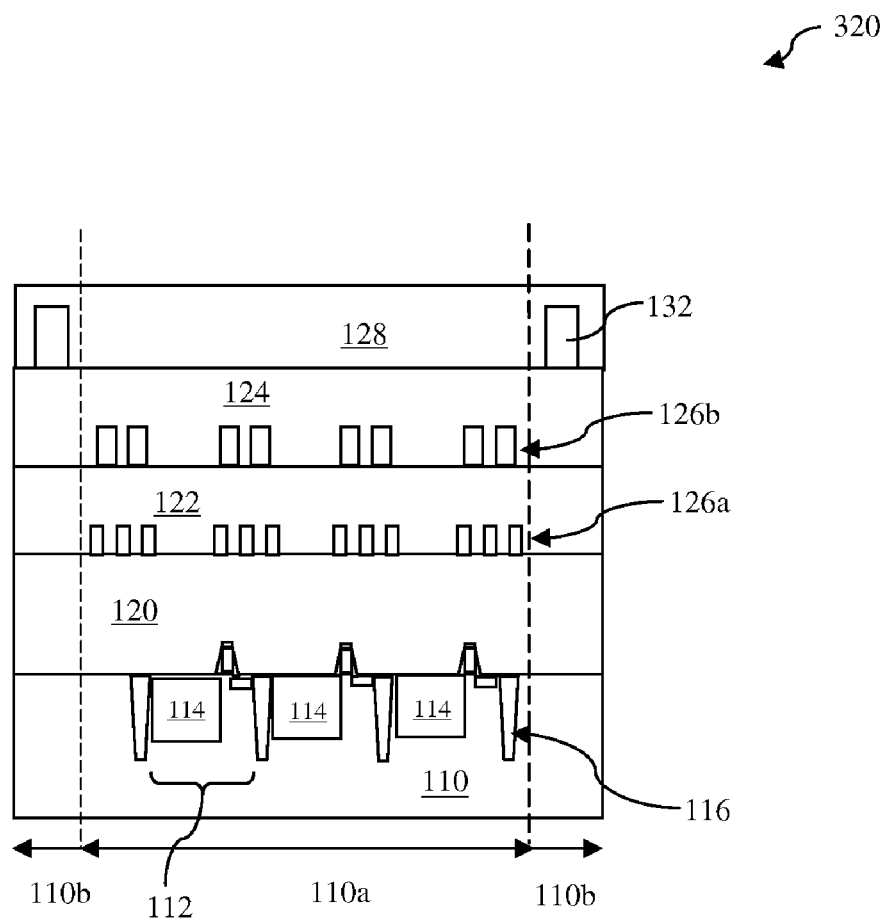
FIGS. 13 through 16 illustrate sectional views of an integrated circuit at various fabrication stages in one embodiment constructed according to aspects of the present disclosure.

Referring to FIG. 13, the method begins by providing a semiconductor substrate 110 and forming one or more image sensors 112 in the substrate and further forming multilayer interconnects (MLI) on the substrate 110. In this example, the MLI includes exemplary layers 126a (metal 1), 126b (metal 2) and 132 (the topmost metal layer). The substrate 110 may further include other features, such as a shallow trench isolation (STI) 116. Each of the image sensors 112 includes an image-sensing region (or light-sensing region) 114, which may be a doped region having N-type and/or P-type dopants formed in the semiconductor substrate. The light-sensing region may have a doping concentration ranging between about $10^{14}$ and $10^{21}$ atoms/cm$^3$. The plurality of image sensors may be designed to have various sensor types and various configurations. For example, one group of image sensors may be CMOS image sensors and another group of image sensors may be passive image sensors.

The multilayer interconnect may be formed by a technique such as CVD, sputtering, plating, other suitable processes, or combinations thereof. For example, PVD may be used to form a copper seed layer, and then a plating process may be employed to deposit bulk copper for interconnection. The three metal layers in FIG. 13 are only for example and simplicity. In various embodiments, MLI may include less or more than three metal layers. MLI is designed and disposed without blocking the image sensor from imaging light. Various dielectric layers including inter-layer dielectric (ILD) 120 and inter-metal dielectric (IMD) 122/124 may be formed by any technique including spin-on, CVD, sputtering, or other suitable processes. For example, plasma enhanced (PE) CVD may be utilized to form silicon oxide from silane (SiH$_4$) or tetraethoxysilane (TEOS). In another example, high density plasma (HDP) CVD may be utilized.

MLI and dielectric layers (ILD/IMD) may be formed in an integrated process referred to as a damascene process, such as a dual damascene process or a single damascene process. In one example, each of a metal layer, via, and contact may be formed by a processing flow described below. An etch stop and/or barrier layer is first formed on the semiconductor device 320. The etch stop layer may include silicon nitride or silicon oxynitride. A dielectric material is deposited on the etch stop layer to form a dielectric layer and may be further planarized by a process such as a chemical mechanical planarizing (CMP) process or an etch back process. A CMP stop layer may be formed on the dielectric layer. The dielectric layer is then etched to form a trench according to a pre-designed circuit pattern by a photolithography process. A lining material layer for barrier and/or adhesion is deposited in the trench by a method such as sputtering. Copper is then filled in the lined trench by a sputtering process to form a copper seed layer and a plating process to form copper filling. Then, copper formed on the dielectric layer may be removed and the semiconductor device 320 may be planarized by a CMP or etch back process. Alternatively, MLI and ILD/IMD may be formed by a dual damascene process in various embodiments known in the art. In another embodiment, as noted above, aluminum is used for interconnect using aluminum technology known in the art. For example, the aluminum alloy including copper and silicon may be used to form interconnection. In this case, a metal etching process may be used to form metal lines. In another embodiment, tungsten may be used to form tungsten plugs for various vias with better via filling effect. The MLI structure may include multiple-layer structures. In one example for copper technology, the multiple-layer structures may include barrier layer, a copper seed layer, and bulk copper. In another example for aluminum technology, the multiple-layer structures may include barrier layer, an aluminum layer, and anti-reflective coating layer (such as titanium nitride). In another embodiment, the topmost metal layer includes aluminum and the rest of the metal layers include copper.

Still referring to FIG. 13, a passivation layer 128 is deposited and further planarized using a chemical mechanical polishing process. The passivation layer 128 includes silicon oxide in one embodiment. The passivation layer 128 may be further etched back to reach the topmost metal layer (e.g., metal-3). In one embodiment, an oxide layer is re-deposited to protect the exposed metal-3 surface. The re-deposited oxide layer may include a thickness ranging between about 50 nanometer and about 100 nanometer. In one embodiment of the device 320, the ILD has a thickness ranging between about 500 nanometer and about 600 nanometer. The first IMD may have a thickness ranging between about 600 nanometer and 700 nanometer. The second IMD may have a thickness ranging between about 700 nanometer and 800 nanometer. The passivation layer 128 may have a thickness ranging between about 600 nanometer and 700 nanometer.

Figure 14:
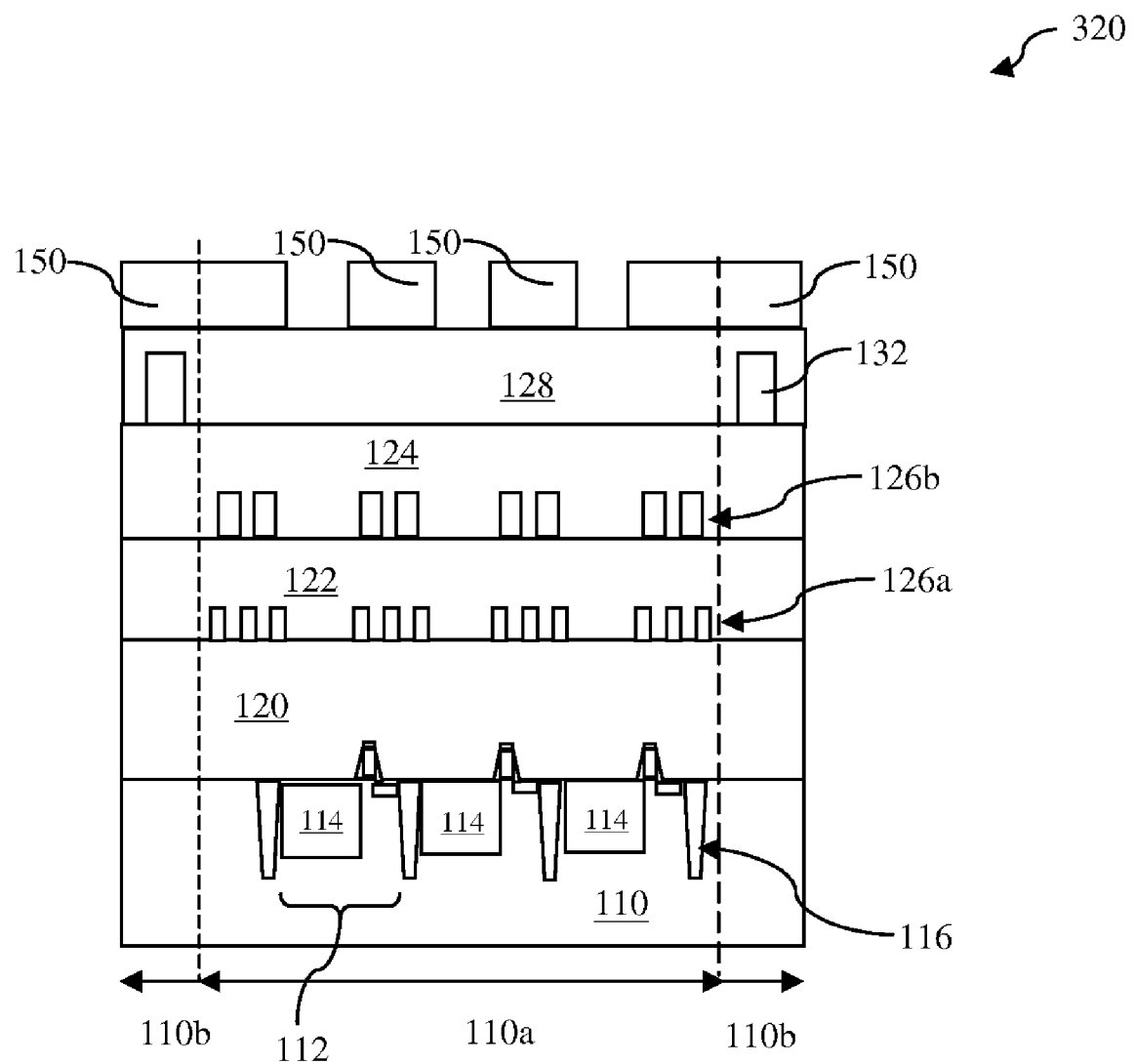

Referring to FIG. 14, a patterned photoresist layer 150 is formed on the MLI and further patterned by a lithography process, defining one or more openings aligned with the image sensor(s). An exemplary photolithography process may include photoresist patterning, etching, and photoresist stripping. The photoresist patterning may further include the processing steps of photoresist coating, soft baking, mask aligning, exposing pattern, post-exposure baking, developing photoresist, and hard baking. Photolithography patterning may also be implemented or replaced by other proper methods, such as maskless photolithography, electron-beam writing, ion-beam writing, and molecular imprint.

Figure 15:
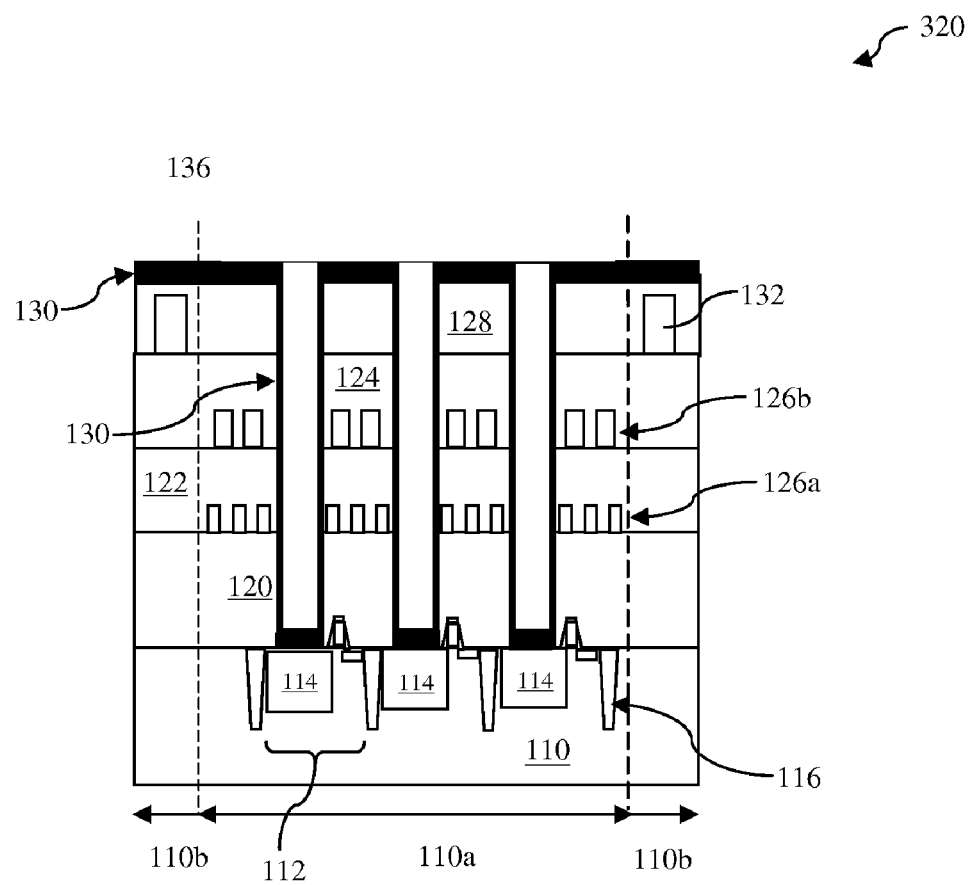

Referring to FIG. 15, one or more hollow structures (a hole or an opening) are formed in the IMD by etching the IMD through the opening of the patterned photoresist layer. Each hollow structure is aligned with one image sensor. The hollow structure has a depth extending to the surface of the image sensor. In other embodiments, the hollow structure does not extend to the surface of the image sensor and a portion of the ILD/IMD remains interposed between the hollow structure and the image sensor.

In one embodiment, the hollow structure may be formed by a processing flow including lithography patterning and etching. For example, a photoresist layer is applied to the passivation/IMD layers and is patterned to have an opening by a lithography process. Then, the passivation/IMD layers are etched through the opening of the patterned photoresist to a proper depth, such as reaching the substrate and exposing the image-sensing region. The etching process may employ a dry etching technique and utilize a carbon fluorine based etchant and oxygen gas. In various embodiments, the carbon fluorine based etchant may include $CF_4$, $CHF_3$, $C_2F_6$, $C_3F_8$, $C_4F_8$, or combinations thereof. The dry etching process may have a processing temperature ranging between about 100 degrees and 150 degrees. Alternatively, the etching process may employ a wet etching technique, utilizing a hydrofluoric acid (HF)-based etchant. The etching process may be monitored and controlled to eliminate over-etching of the semiconductor substrate 110 and the image sensor 112 formed therein. In another embodiment, an etch stop layer may be formed on the semiconductor substrate 110 before the formation of the ILD 120. Thus, the etching process will stop on the etch stop layer. The etch stop layer in the trench may be removed by other etching processes to expose the underlying image sensor. In another embodiment, an etch stop layer may be disposed at a predefined level such that the hole extends thereto. In another embodiment, a hard mask layer may be utilized in forming the hole. In one embodiment, a dry etching process and a wet etching process are combined to form the hole with a tapered profile. For example, a dry etching is applied first and a wet etching process is applied thereafter such that a tapered hole with a wider opening is achieved. In another embodiment, multiple etching steps may be implemented with multiple photolithography processing steps and multiple etch stop layers to form a stepwise hole with a wider opening. In one example, a hard mask layer is applied to the passivation/IMD layers. A photoresist layer is applied on the hard mask layer and patterned to form an opening by a lithography process. The hard mask layer is then etched to transfer the opening from the photoresist layer to the hard mask layer. The photoresist layer is removed by a wet stripping or a plasma ashing thereafter. Then, the IMD is etched through the opening of the hard mask layer to form the hole.

After the formation of the hollow structure, an oxide layer may be re-deposited on the device 320 including the sidewalls of the hollow structure. The oxide layer (not shown) may have a thickness ranging between about 50 nanometer and about 200 nanometer. A second passivation layer 130 is thereafter formed on the device 320 including the sidewalls of the hollow structure. The second passivation layer 130 includes silicon nitride and may have a thickness ranging between about 50 nanometer and about 200 nanometer.

The additional process includes applying a lithography process to define pad open areas for a bonding pad or a test pad. An etching process is applied to the device 320 to form pad openings. The photoresist is removed after the pad openings are formed.

Figure 16:
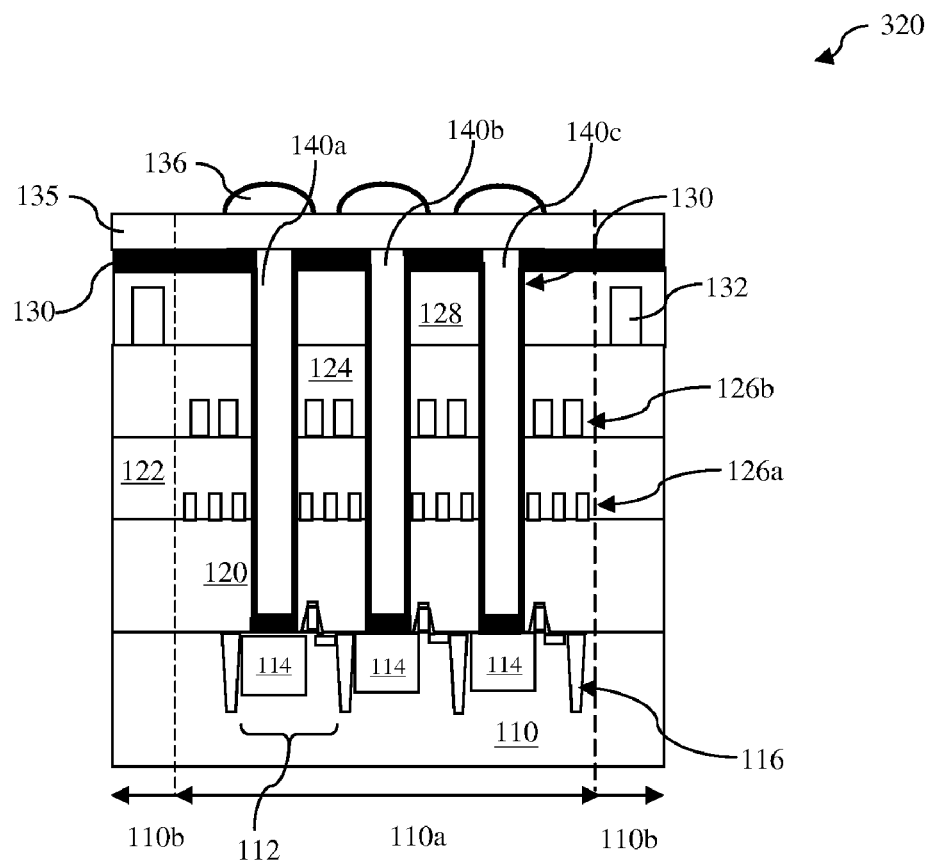

Referring to FIG. 16, one or more color filter materials are filled into various hollow structures. For example, a red color filter material is filled in a hollow structure to form a red color filter feature 140a, a green color filter material is filled in a hollow structure to form a green color filter 140b, and a blue color filter material is filled in a hollow structure to form a blue color filter 140c. A planarizing process may be further applied to the device 320, after the color filter material is filled in the hole, to planarize the device 320 and remove excessive color filter material. The planarizing process may include an etch back, CMP, or combinations thereof.

A flat layer 135 is further formed on the device 320. One or more micro lenses 136 are formed on the flat layer 135 such that each micro lens is aligned with the associated color filter and the image sensor.

FIGS. 17 through 24 illustrate sectional views of an image sensor device 330 at various fabrication stages in another embodiment constructed according to aspects of the present disclosure. The image sensor device 330 and the method of making the same are further provided as another example and are collectively described below with reference to FIGS. 17 through 24.

Figure 17:
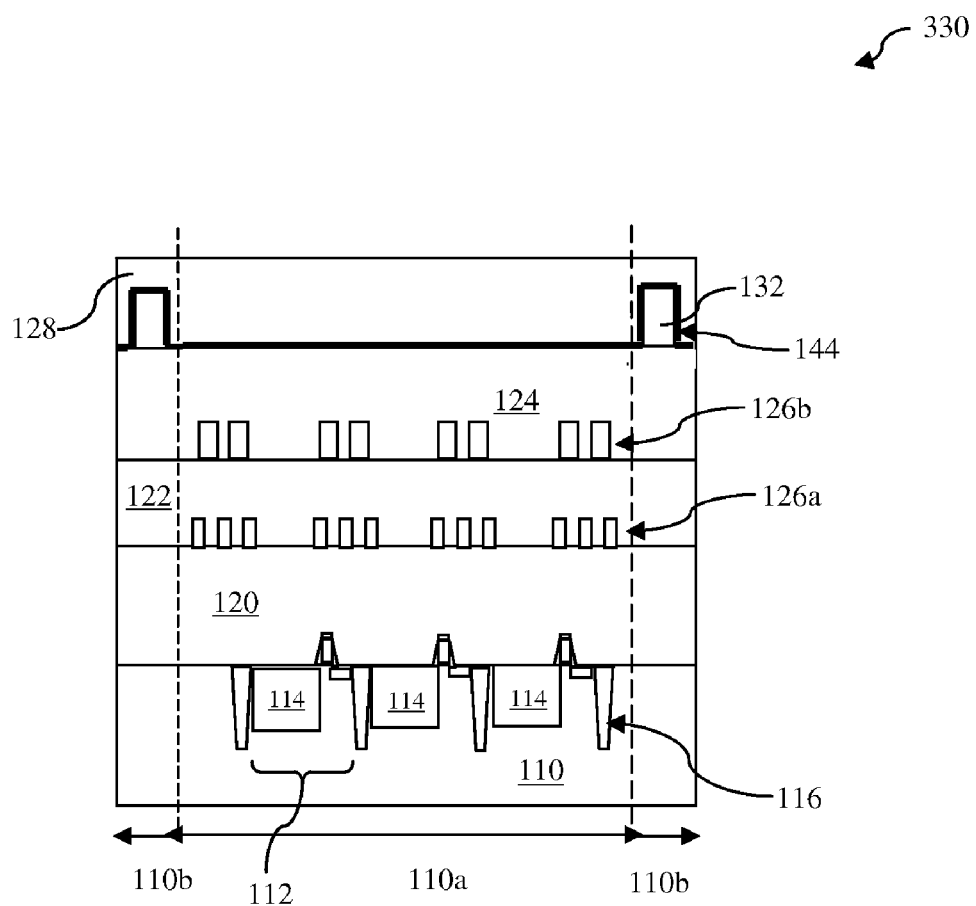
FIGS. 17 through 24 illustrate sectional views of an integrated circuit at various fabrication stages in one embodiment constructed according to aspects of the present disclosure.

Referring to FIG. 17, the method begins by providing a semiconductor substrate 110 and forming one or more image sensors 112 in the substrate and further forming multilayer interconnects (MLI) on the substrate. The substrate 110 may further include other features, such as a shallow trench isolation (STI) 116. The image sensors are disposed in the semiconductor substrate. Each image sensor includes a imaging-sensing region (or light-sensing region), which may be a doped region having N-type and/or P-type dopants formed in the semiconductor substrate.

The multilayer interconnect may be formed by CVD, sputtering, plating, other suitable processes, or combinations thereof. For example, PVD may be used to form a copper seed layer, and then a plating process may be employed to deposit bulk copper for interconnection. In another embodiment, aluminum may be used to form aluminum-based interconnect using aluminum technology. The three metal layers in FIG. 17 are only for example and simplicity. In this example, the MLI includes exemplary layers 126a (metal 1), 126b (metal 2) and 132 (the topmost metal layer). In various embodiments, MLI may include less or more than three metal layers. MLI is designed and disposed without blocking the image sensor from imaging light. The topmost metal features (metal 3 in this particular example) are formed in the periphery area surrounding a pixel array area. The topmost metal layer is etched to form the topmost metal features, and an etch stop layer 144 is deposited thereafter. The etch stop layer 144 may have a thickness of about 500 A.

Still referring to FIG. 17, a passivation layer 128 is deposited and further planarized using a chemical mechanical polishing process. The passivation layer 128 includes silicon oxide in one embodiment. In one embodiment, the passivation layer 128 includes silicon oxide. The passivation layer 128 may be further etched back to reach the topmost metal layer. In one embodiment, an oxide layer is re-deposited to protect the exposed topmost metal surface. The re-deposited oxide layer may include a thickness ranging between about 50 nanometer and about 100 nanometer. In various embodiments of the device 330, the ILD has a thickness ranging between about 500 nanometer and about 600 nanometer. The first IMD may have a thickness ranging between about 600 nanometer and about 700 nanometer. The second IMD may have a thickness ranging between about 700 nanometer and 800 nanometer. The passivation layer 128 may have a thickness ranging between about 600 nanometer and 700 nanometer.

Figure 18:
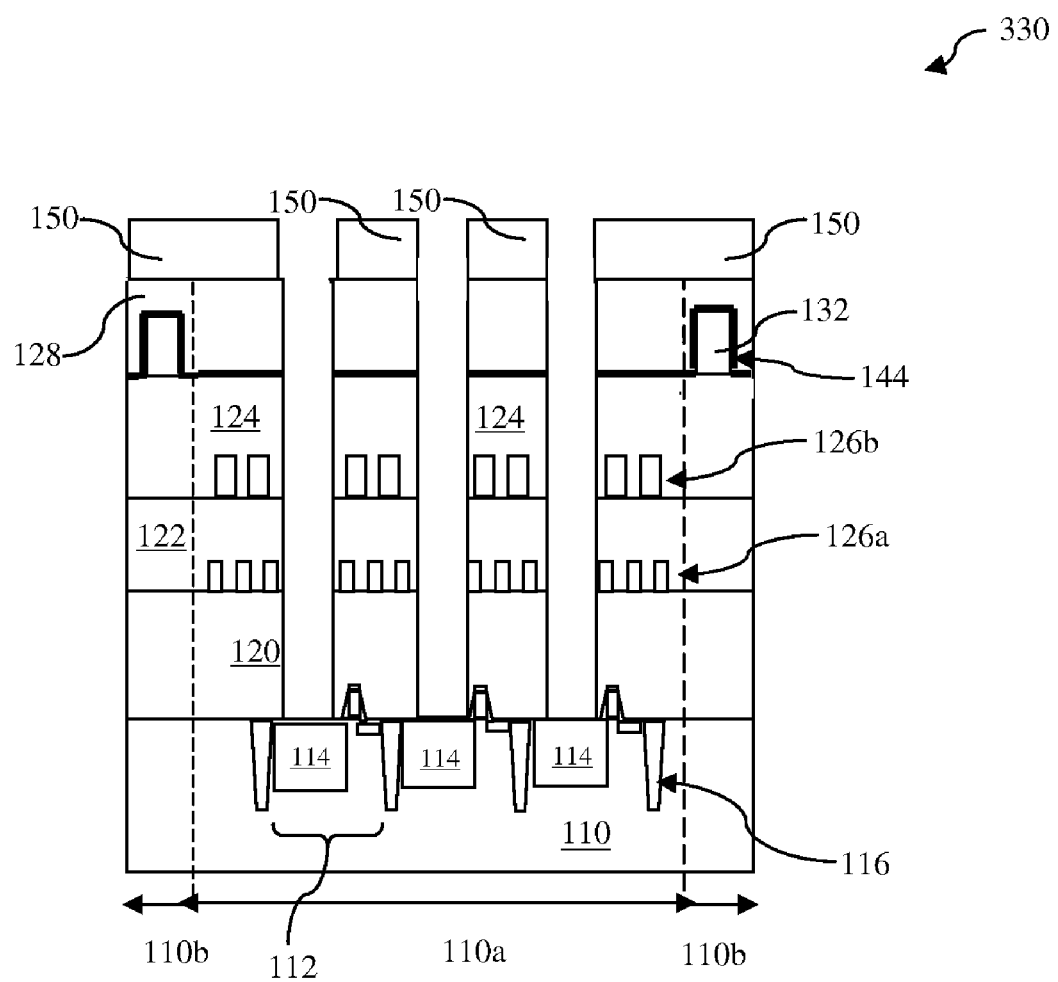

Referring to FIG. 18, a patterned photoresist layer 150 is formed on the MLI and further patterned by a lithography process, defining one or more openings aligned with the image sensor(s). An exemplary photolithography process may include photoresist patterning, etching, and photoresist stripping. The photoresist patterning may further include the processing steps of photoresist coating, soft baking, mask aligning, exposing pattern, post-exposure baking, developing photoresist, and hard baking.

One or more hollow structures (a hole or an opening) are formed in the IMD by etching the IMD through the opening of the patterned photoresist layer 150. Each hollow structure is aligned with one image sensor. The hollow structure has a depth extending to the surface of the image sensor. Alternatively, the hollow structure extends to an etch stop layer formed on the substrate. Thus, the etching process can be properly stopped at the etch stop layer. In other embodiments, the hollow structure does not extend to the surface of the image sensor and a portion of the ILD/IMD remains interposed between the hollow structure and the image sensor.

The hole may be formed by a processing flow including lithography patterning and etching. For example, a photoresist layer is applied to the passivation/IMD layers and is patterned to have an opening by a lithography process. Then, the passivation/IMD layers are etched through the opening of the patterned photoresist to a proper depth, such as reaching the substrate and exposing the image-sensing region. The etching process may employ a dry etching technique and utilize a carbon fluorine based etchant and oxygen gas. In various embodiments, the carbon fluorine based etchant may include $CF_4$, $CHF_3$, $C_2F_6$, $C_3F_8$, $C_4F_8$, or combinations thereof. The dry etching process may have a processing temperature ranging between about 100 degrees and 150 degrees. Alternatively, the etching process may employ a wet etching technique, utilizing a hydrofluoric acid (HF)-based etchant. The etching process may be monitored and controlled to eliminate over-etching of the semiconductor substrate 110 and the image sensor 112 formed therein. In another embodiment, an etch stop layer may be formed on the semiconductor substrate 110 before the formation of the ILD 120. Thus, the etching process will stop on the etch stop layer. The etch stop layer in the trench may be removed by other etching processes to expose the underlying image sensor. In another embodiment, an etch stop layer may be disposed at a predefined level such that the hole extends thereto. In another embodiment, a hard mask layer may be utilized in forming the hole. In one embodiment, a dry etching process and a wet etching process are combined to form the hole with a tapered profile. For example, a dry etching is applied first and a wet etching process is applied thereafter such that a tapered hole with a wider opening is achieved. In another embodiment, multiple etching steps may be implemented with multiple photolithography processing steps and multiple etch stop layers to form a stepwise hole with a wider opening. In one example, a hard mask layer is applied to the passivation/IMD layers. A photoresist layer is applied on the hard mask layer and patterned to form an opening by a lithography process. The hard mask layer is then etched to transfer the opening from the photoresist layer to the hard mask layer. The photoresist layer is removed by a wet stripping or a plasma ashing thereafter. Then, the IMD is etched through the opening of the hard mask layer to form the hole.

Figure 19:
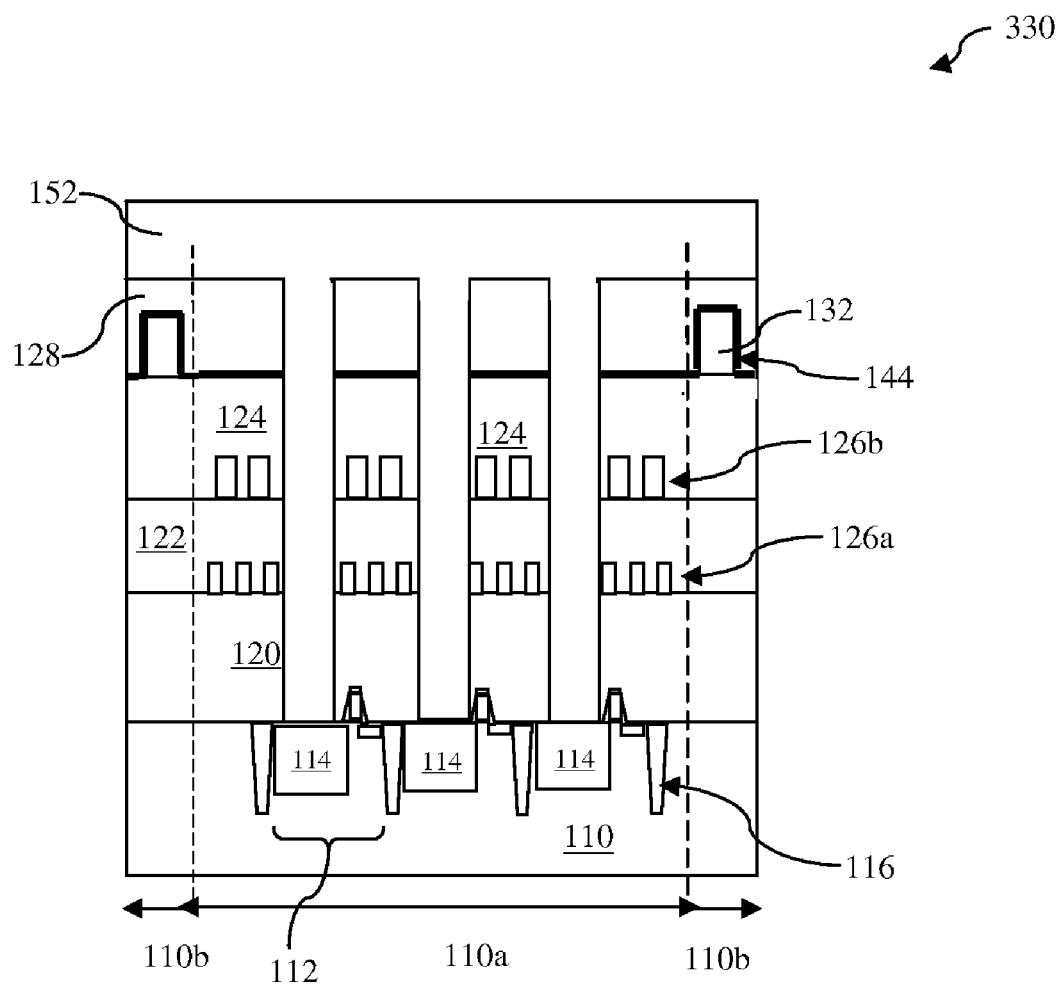
Figure 20:
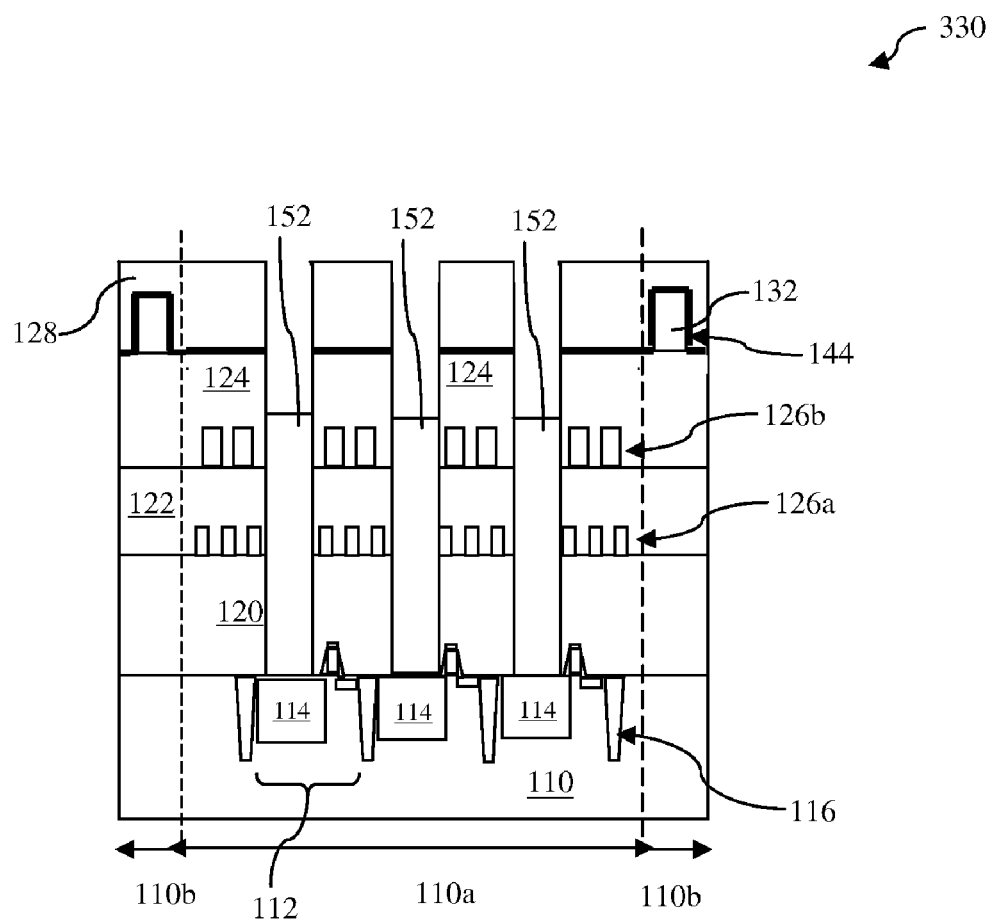

Referring to FIG. 19, a plug photoresist material 152 is filled in the hollow structure by a method, such as spin-coating. The plug photoresist material 152 is then etched to a suitable depth as illustrated in FIG. 20. For example, the top surface of the remaining photoresist material 152 is about 100 nanometer below the etch stop layer 144.

Figure 21:
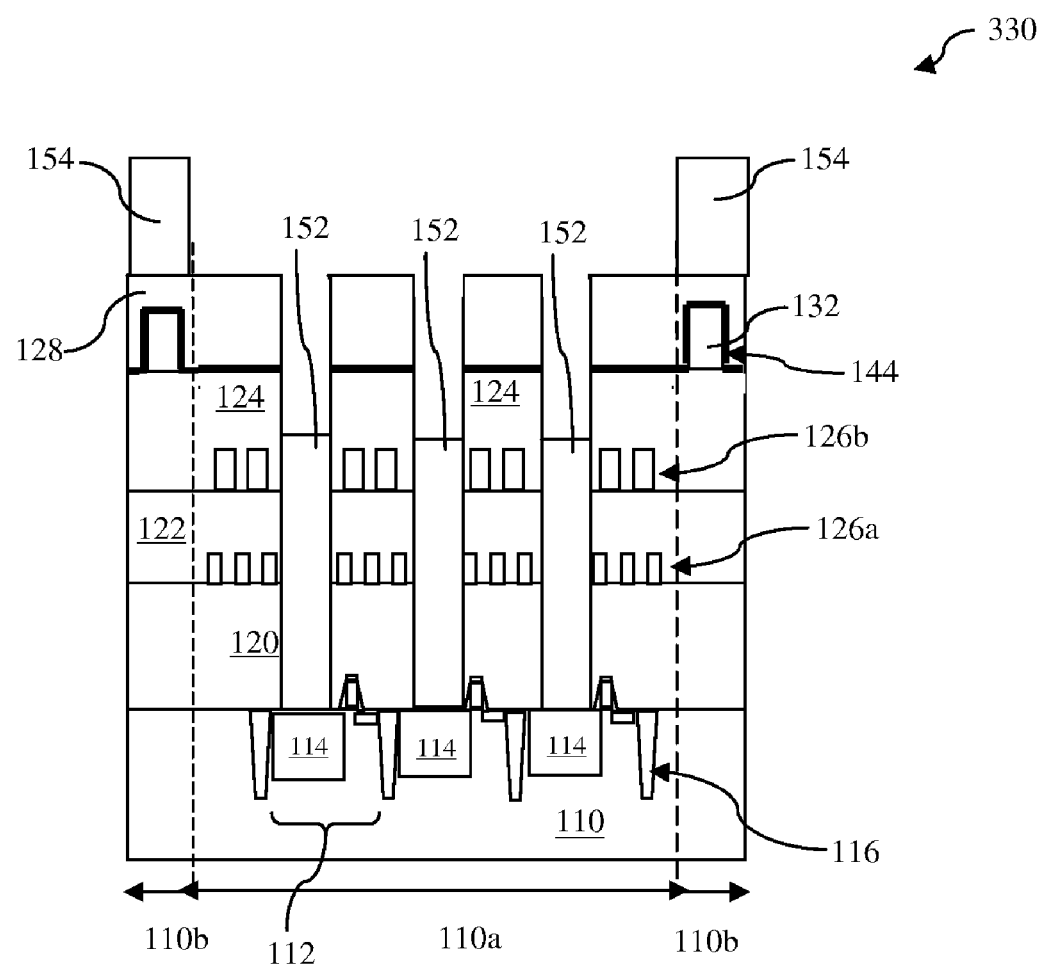
Figure 22:
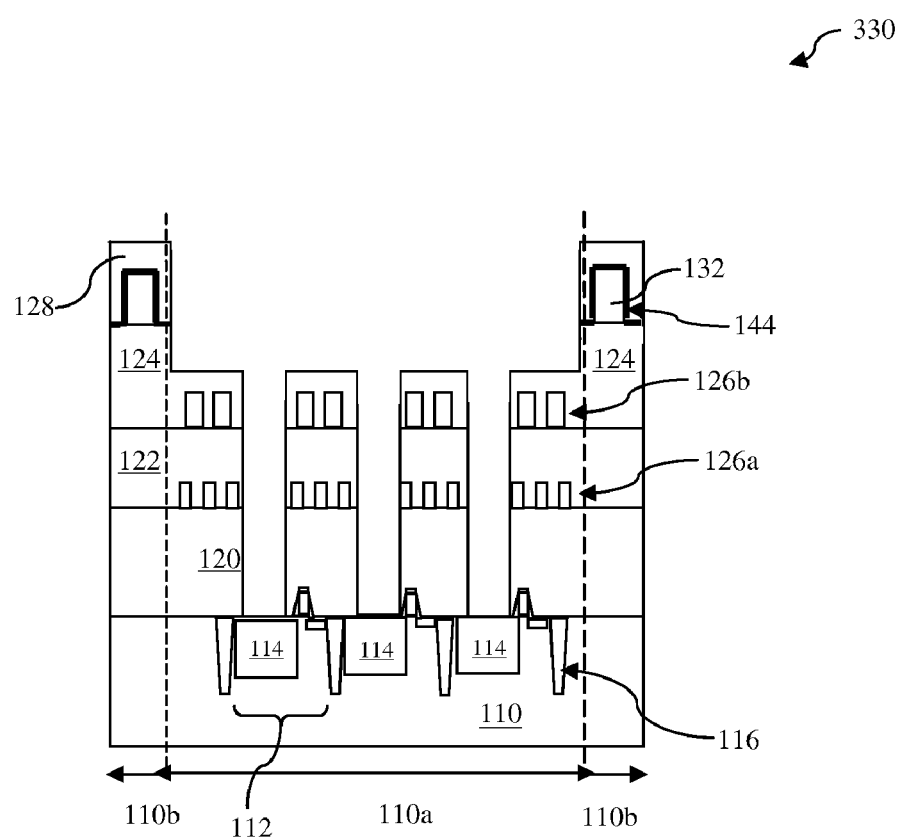

A canyon structure area is defined on the device 330 by a photolithography process as illustrated in FIG. 21. Referring to FIG. 22, a first etch-back process is applied to the device 300 to selectively etch until reaching the etch stop layer to prevent fence effect and improve uniformity. Then, a second etch-back process is applied to the device 330 until the remaining IMD layer on the metal-2 layer is about 70 nanometer to about 130 nanometer in one example. The patterned photoresist layer is removed.

Figure 23:
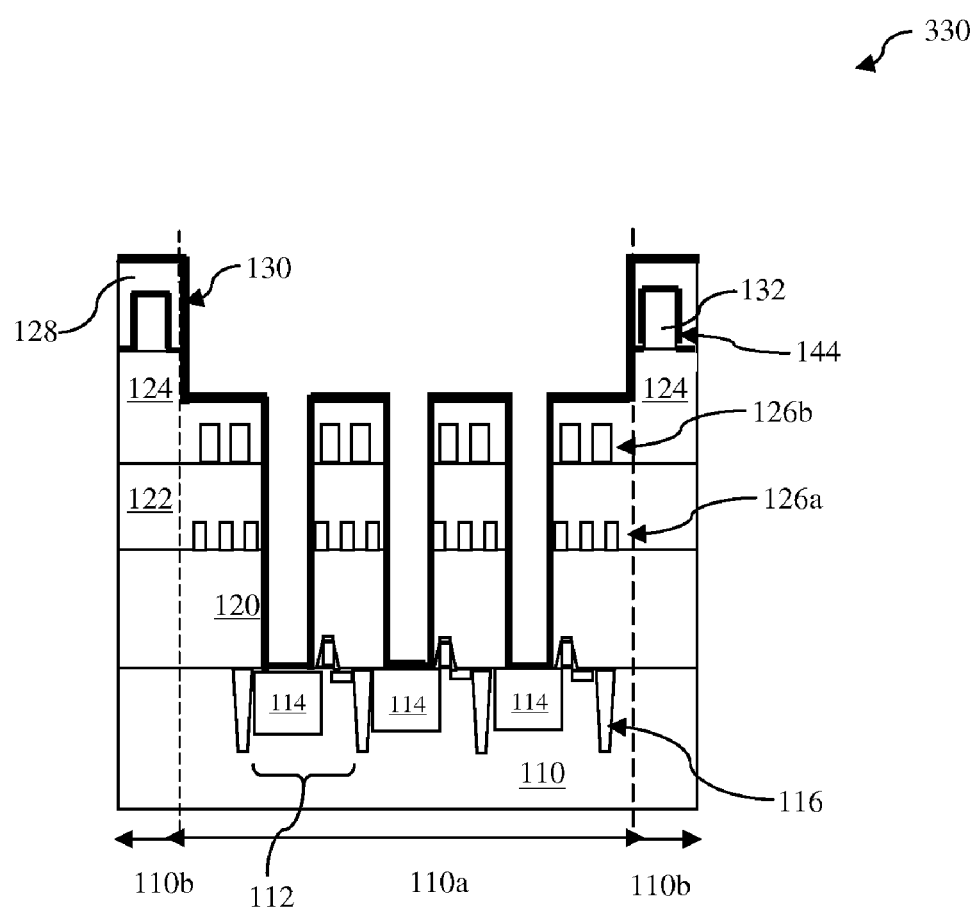

Referring to FIG. 23, an oxide layer may be re-deposited on the device 330 including the sidewalls of the hollow structure. The oxide layer (not shown) may have a thickness ranging between about 50 nanometer and about 200 nanometer. A second passivation layer 130 is thereafter formed on the device 330 including the sidewalls of the hollow structure. The second passivation layer includes silicon nitride and may have a thickness ranging between about 50 nanometer and about 200 nanometer.

The additional process includes applying a lithography process to define pad open areas for a bonding pad or a test pad. An etching process is applied to the device 330 to form pad openings. The photoresist is removed after the pad openings are formed.

Figure 24:
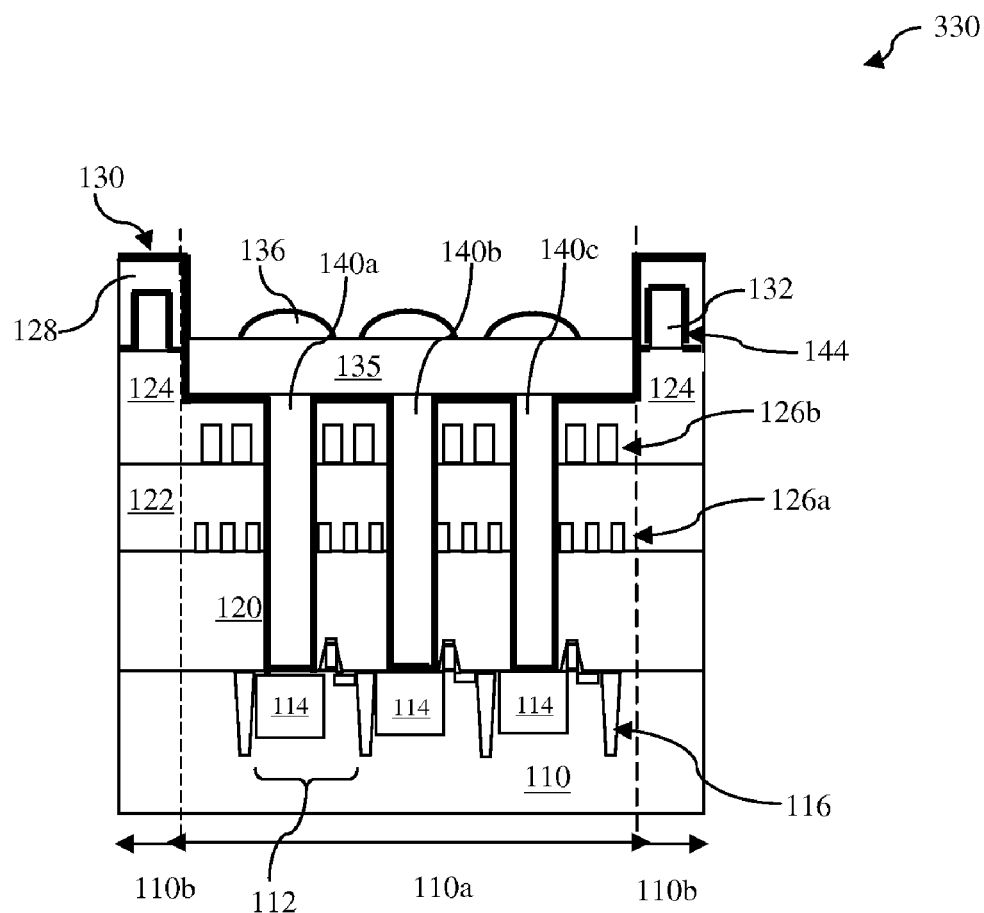

Referring to FIG. 24, one or more color filter materials are filled into various hollow structures. For example, a red color filter material is filled in a hollow structure to form a red color filter 140a, a green color filter material is filled in a hollow structure to form a green color filter 140b, and a blue color filter material is filled in a hollow structure to form a blue color filter 140c.

A flat layer 130 is further formed coated on the device 320. One or more micro lenses 136 are formed on the flat layer such that each micro lens is aligned with the associated color filter and the image sensor. In this configuration, the optical path from the micro lens to the image sensor is further reduced.

Image sensor devices and the method making of making such are described above in various embodiments. Other variations are suggestive within the scope of the invention. For example, the lining material layer formed on sidewalls of the hollow structure may be additionally formed on the bottom of the hollow structure. The lining material layer may include nitrogen-containing materials, such as silicon nitride, silicon oxynitride, or other suitable materials. In another embodiment, the color filter may have other suitable shapes to fit other applications or match the image-sensing region. In another embodiment, the topmost metal layer may use other suitable metal or metal alloy for process and material integration compatibility. In another embodiment, the color filter may include other dielectric materials transparent to only one of red, green, and blue visible lights. In another embodiment, the image sensor includes a pinned photodiode. In various embodiments of the interconnection, the metal lines may be formed by copper, aluminum, or other proper technology.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An image sensor semiconductor device, comprising:
an image sensor disposed in a semiconductor substrate;
an inter-level dielectric (ILD) layer disposed on the semiconductor substrate;
a plurality of inter-metal-dielectric (IMD) layers and multi-layer interconnects (MLI) formed on the ILD layer; and
a color filter formed in at least one of the IMD layers and the ILD layer and overlying the image sensor.

2. The device of claim 1, wherein the color filter comprises a dielectric material transparent to only one of red visible light, green visible light, and blue visible light.

3. The device of claim 1, wherein the color filter extends into the ILD.

4. The device of claim 1, wherein the color filter feature comprises a height ranging between about 300 nanometer and about 5000 nanometer.

5. The device of claim 1, wherein the color filter comprises a sectional area ranging between about 0.36 micron$^2$ and about 17.64 micron$^2$.

6. The device of claim 1, wherein the color filter comprises one of a circular shape in sectional view and a rectangular shape in sectional view.

7. The device of claim 1, wherein the color filter comprises a tapered profile with a greater sectional area at a top surface of the color filter.

8. The device of claim 1, wherein the color filter comprises a multi-step profile with a decreased dimension from top to bottom.

9. The device of claim 1, wherein the image sensor comprises one of a photodiode and a pinned photodiode.

10. The device of claim 1, wherein the MLI further comprises a topmost metal feature disposed horizontally within a peripheral region and vertically above the color filter, the topmost metal feature extending vertically within a first dimension; and
a micro lens overlying the color filter and vertically extending at least partially within the first dimension.

11. The device of claim 10, wherein the topmost interconnect feature comprises at least one of a bonding pad and a probe test pad.

12. The device of claim 1, wherein the color filter is further enclosed with a lining material layer.

13. The device of claim 12, wherein the lining material layer comprises silicon nitride.

14. A method of fabricating a semiconductor device, comprising:
forming an image sensor in a semiconductor substrate;
forming an interlayer dielectric (ILD) layer on the semiconductor substrate;
forming a plurality of inter-metal-dielectric (IMD) layers and multilayer interconnects (MLI) on the ILD layer;
forming a hole that extends vertically within at least one of the IMD layers and the ILD layer and overlying the image sensor; and
filling the hole with a color filter material to form a color filter.

15. The method of claim 14, further comprising:
forming a topmost metal feature horizontally within a peripheral region and vertically above the MLI and the color filter, the topmost metal feature vertically extending within a first dimension; and
forming a micro lens overlying the color filter and vertically extending at least partially within the first dimension.

16. The method of claim 14, further comprising lining the hole with a dielectric material layer before the filling.

17. The method of claim 14, wherein the forming of the hole comprises one of:
forming the hole with a tapered profile by implementing a tunable etching process; and forming the hole with a tapered profile by implementing a dry etching process and then a wet etching process.

18. An image sensor device, comprising:
an image sensor element disposed in a silicon substrate;
an inter-level dielectric (ILD) layer disposed on the semiconductor substrate;
a plurality of inter-metal-dielectric (IMD) layers and multilayer interconnects (MLI) formed on the ILD layer; and
a color filter disposed in a structure that extends vertically within the IMD layers and the ILD layer, the color filter being vertically aligned with an image-sensing region of the image sensor.

19. The image sensor device of claim 18, further comprising a topmost metal feature above the MLI and the color filter.

20. The image sensor device of claim 18, further comprising a dielectric material layer lined in the structure.

* * * * *